(12) United States Patent
Nicolussi

(10) Patent No.: US 6,902,774 B2
(45) Date of Patent: Jun. 7, 2005

(54) METHOD OF MANUFACTURING A DEVICE

(75) Inventor: Guenther Nicolussi, Feldkirch (AT)

(73) Assignee: Inficon GmbH, Bad Ragaz (CH)

( * ) Notice: Subject to any disclaimer, the term of this patent is extended or adjusted under 35 U.S.C. 154(b) by 323 days.

(21) Appl. No.: 10/202,387

(22) Filed: Jul. 25, 2002

(65) Prior Publication Data

US 2004/0018320 A1 Jan. 29, 2004

(51) Int. Cl.$^7$ .............................................. H05H 1/24
(52) U.S. Cl. .................... 427/535; 427/539; 427/569; 156/272.6; 156/273.3
(58) Field of Search .................. 156/272.2, 272.6, 156/273.3; 427/535, 539, 569

(56) References Cited

U.S. PATENT DOCUMENTS

| | | |
|---|---|---|
| 5,308,950 A | 5/1994 | Ramm et al. |
| 5,336,326 A | 8/1994 | Karner et al. |
| 5,384,018 A | 1/1995 | Ramm et al. |
| 5,409,543 A | 4/1995 | Panitz et al. |
| 6,203,637 B1 | 3/2001 | Dommann et al. |
| 6,605,175 B1 * | 8/2003 | Ramm et al. ............ 156/272.6 |

FOREIGN PATENT DOCUMENTS

| | | | |
|---|---|---|---|
| DE | 4029268 | 3/1992 | |
| DE | 4029270 | 4/1992 | |
| DE | 4310941 | 12/1993 | |
| EP | 0371693 | 6/1990 | |
| EP | 0427020 | 5/1991 | |
| EP | 0510340 | 10/1992 | |
| GB | 2267387 | 12/1993 | |
| JP | 2140925 | 5/1990 | |
| JP | 03232957 A * | 10/1991 | ............. C23C/8/36 |
| WO | 97/39472 | 10/1997 | |
| WO | 00/48779 | 8/2000 | |

OTHER PUBLICATIONS

Copy of Specification, Drawings, and Official Filing Receipt of patent U.S. Appl. No. 10/270,495, filed on Oct. 16, 2002.

LFC, Plasma Cleaning Systems, Most Effective Plasma Chemical Cleaning for Demanding Applications, INFICON, 8 pages, 2001.

* cited by examiner

*Primary Examiner*—John T. Haran
(74) *Attorney, Agent, or Firm*—Crowell & Moring LLP

(57) ABSTRACT

A method of manufacturing a device includes activating a gas containing at least one of hydrogen and of nitrogen by a hollow cathode discharge and exposing a first surface of a first material to the activated gas, thereby generating at the first surface an enrichment of at least one of hydrogen and of nitrogen and applying a further treatment to the enriched surface.

40 Claims, 14 Drawing Sheets

METHOD OF MANUFACTURING A DEVICE

The present invention primarily relates to a process treatment of surfaces which can subsequently be connected.
Definitions:

Intimate "connection processes" are bonding (welding, soldering) as well as gluing. The surfaces may be metal surfaces, particularly Cu, Ni, Ag, Au, Pd, Si or plastic surfaces, for example, on an epoxy or ester basis. Such surfaces are often covered by oxides, nitrides or polyimides. The energy supply for the above-mentioned connections is basically of a thermal type, and the energy is supplied to the surfaces to be connected, for example, by means of heated tools, the Joule effect, UV radiation or preferably by ultrasound or by means of reaction energy when gluing.

"Passivation" or passivated: See *Römpp's Chemical Dictionary*, Franckh'sche Verlagshandlung Stuttgart, Edition 8, Page 3005. It is a bonded protective covering of the basic body surface. The clean basic body surface is protected from atmospheric air influences. This takes place, for example, by forming an oxide or nitride layer. For the establishment of a connection of the above-mentioned type, such a layer must first be opened up by energy which must be applied specifically for this purpose, for example, by applying higher temperatures than required for the actual bonding operation, or chemically, for example, by using a flux.

Conserving, which, in particular, requires no opening-up of the layer by additional energy during the bonding, differs fundamentally from the above-mentioned passivating. This conservation was recognized only in conjunction with and by way of the present invention which is used in a particularly advantageous manner when packaging integrated circuits.

During the so-called "packaging" of integrated circuits, several operations are distinguished which comprise a bonding of surfaces in the above-mentioned sense:

1. The individual integrated circuits are cut out of a silicon wafer and are applied to semiconductor system carriers (HLST) and are bonded with these (the so-called die bonding). The semiconductor system carrier surface is normally made of copper or of nickel, silver or gold or of a material on an epoxy basis, generally of a plastic material. Examples of such semiconductor system carriers are punched or etched metallic lead frames, ceramic substrates or ball grid array substrate carriers made of plastic. Hard soldering, soft soldering and gluing are used as bonding processes. In the case of flip chip solder processes, the integrated circuit is applied to a semiconductor system carrier by geometrically separated solder balls which are simultaneously used as an I/O-bonding.

2. Bonding the integrated circuits with contact support points on the semiconductor system carrier, as, for example, on the lead frame. The participating surfaces are metallic; for example, of Al, Au, Cu, Ni, Pd. Here, soldering or welding, particularly flux-free soldering or ultrasonic welding, are used as bonding techniques. This step is known as wire bonding.

3. Molding: In this process step, the circuits are molded by a molding material on the semiconductor system carriers, for example, the lead frames, after the wire bonding, the above-mentioned surfaces of the semiconductor system carriers and the integrated circuits participating with respect to the molding material.

Within the scope of a connection process for metallic surfaces, a cleaning process is known from EP-0 371 693, in which the surfaces, which subsequently are to be bonded in the above-mentioned sense only by the feeding of energy, are first exposed to a microwave plasma discharge in a hydrogen-containing vacuum atmosphere. Then, without breaking the vacuum, the provided solder layer is melted open by the plasma discharge for bonding the surfaces. Thus, by avoiding a contact with air, a contaminating surface coating, which would highly interfere with the subsequent bonding process, is avoided.

U.S. Pat. No. 5,409,543 describes the use of activated hydrogen for preparing a soldering operation. As a result, an oxide layer is opened up for the reaching-through of the soldering operation to the metal surface.

EP-A-0 427 020 describes a process which pickles, i.e, opens up a passive layer and oxide layer of joining partners by a preliminary high-frequency plasma treatment using a process gas. Gases or gas mixtures are used which, among others, consist of $O_2$, $H_2$, $Cl_2$, $N_2O$, $N_2$, $CF_4$, etc.

If the above-mentioned pickling does not take place, immediately before the soldering operation, the joining partners are stored in protective intermediate storage devices, for which suitable receptacles, which are subjected to a protective gas, are provided for preventing contamination.

The present invention under its first aspect is based on the recognition that the treatment of a surface in an atmosphere, preferably in a vacuum atmosphere, with activated hydrogen, leads to a conservation of the surfaces with respect to air. This conservation even permits the storing of the surfaces after the "treatment" and before their bonding, in air, without the occurrence of the above-mentioned disadvantages with respect to bondability. Qualitatively, the bonding which takes place subsequently is not worse than if it had been established directly in the vacuum of the treatment step or, generally without exposing the surfaces to air.

Often cleaning treatment processes to be carried out for surfaces to be subsequently bonded are limited by the capacity of the participating parts to be thermally stressed. This applies particularly, if one group of surfaces are surfaces of the above-mentioned integrated circuits.

All processes of the above-mentioned IC packaging are critical, particularly if, for reasons of cost, certain semiconductor system carrier materials are to be used. Organic semiconductor system carrier materials should not be exposed to high temperatures. In addition, with an increasing number of electrical connections of the integrated circuits and decreasing cross-section of the connection wires a high reproducibility of the individual connections must be ensured in order to maximize production yield.

In addition to a high connection reproducibility, it is an object of the present invention to efficiently generate activated hydrogen but to simultaneously minimize the thermal stressing of the treated surfaces. This is achieved in that, when a plasma discharge is used for activating the hydrogen, this is preferably implemented as a low-voltage discharge.

A low-voltage discharge is a plasma discharge having a plasma potential of at most 30 V. In case of a DC low voltage discharge this is typically activated by means of a thermionic cathode.

The present invention also encompasses intimately connecting surfaces, which were previously treated in activated hydrogen and were thus conserved, were then exposed to air before being subjected to the connection process. It is understood that this results in a high manufacturing flexibility.

Reference can be made to the following documents which are merely background:

Research Disclosure 307 107, wherein, in connection with a hardening process, a hard layer is produced by the action of an electron beam upon a surface;

GB-2 131 619, according to which mechanically loaded electric contact surfaces of switching contacts and a plasma discharge, preferably a high-frequency plasma discharge, are provided in an atmosphere containing hydrogen, oxygen, sulfur hexafluoride, etc.;

S. Veprek, et al., "Recent Progress in the Restoration of Archeological Metallic Artifacts by Means of Low-Pressure Plasma Treatment", from *Plasma Chemistry and Plasma Processing,* Vol. 8, No. 4, 1988, according to which surfaces of archeological metallic findings are conserved in a plasma discharge in a hydrogen-containing atmosphere; K. Pickering, et al., "Hydrogen Plasmas for Flux-Free Flip-Chip Solder Bonding", from J. Vac. Sci. Technol. A8(3), May/June 1990, American Vacuum Society, according to which Pb—Sn soldering takes place in an atmosphere containing a microwave plasma in hydrogen;

V. Zhukov, et al., "Coadsorption of Hydrogen and Potassium on Silver Single Crystal Surfaces" from Pergamon, *Vacuum,* Volume 47, Number 1, 1995, Elsevier Science Ltd., according to which it was determined that precious metal surfaces are passivated by hydrogen adsorption;

N. Koopman, et al., "Fluxless Soldering in Air and Nitrogen", from I.N., 1993 *Proceedings,* 43rd Electronic Components and Technology Conference (Cat. No. 93CH3205/2), *Proceedings of IEEE,* 43rd Electronic Components and Technology Conference (ECTC'93) Orlando, 1st to 4th of June 1993, in which oxides on a solder surface are changed to oxyfluorides. As a result, a high passivation is achieved with respect to air so that, before the reflow bonding, surfaces treated in this manner can be stored in air for up to a week.

Under the aspect of further improving the invention as discussed above it is a further object to provide a method for manufacturing a device, which allows for easier control of the treatment of surfaces in plasma-activated gas.

Additionally it has been recognized that it is often desirable to switch the treating process as outlined above on and off, e.g. to change process gas, which is only possible by making use of a low-voltage discharge realized with a thermionic cathode to a restricted extent. This because heating up of the thermionic cathode and stabilizing the discharge necessitates considerable time, which may be of several ten seconds. This bars realization of a manufacturing method which includes the above described processing within vacuum multi-processing, whereat processes are switched on and off as devices or workpieces are applied in a time sequence manner, e.g. workpieces are applied to one process, this process is switched on, is switched off after treatment of the workpieces and the treated workpieces are removed from and applied to a subsequent process. Thus, it would be most advantageous to conceive the process as outlined above, which might nevertheless be rapidly switched on and off, i.e. with switching time spars to stable conditions which are considerably improved.

Attention is further drawn to the co-pending U.S. application Ser. No. 09/257 207 and the respective publication WO 00/48779. Therein there is described a process as was described herein, but making use of activated nitrogen instead of or additionally to activated hydrogen.

This U.S. application and the respective publication in said WO 00/48779 shall be part of the present description as referred to by reference.

The object of improving the above mentioned process, thereby making use of activated hydrogen and/or of activated nitrogen with the target of enabling industrial manufacturing simultaneously is realized by activating a gas containing at least one of hydrogen and of nitrogen by a hollow cathode discharge, exposing a first surface of a first material and of at least one first part to said activated hydrogen and/or nitrogen, thereby generating a hydrogen and/or nitrogen enrichment of said first surface and applying a further treatment to the enriched surface.

Hollow cathode discharges and devices to realize such hollow cathode discharges are amply known to the skilled artisan Reference may be made e.g. to "Muiti-jet hollow cathode discharge for remote polymer deposition", D. Korzec et al., 0257-8972/97/$17.00, 1997, Elsevier Science S.A., which article forming part of the present description with respect to possible realization of hollow cathode discharge arrangements by reference.

In spite of the fact that it is a primary goal of the present invention to treat a surface of a first material by the said activated hydrogen and/or nitrogen so as to reach a surface conservation with an eye on subsequent ambient air exposure of such a surface and nevertheless maintain ability of such a surface to be directly intimately connected to a further material or equal material part, especially the fact that the activation of the gas containing hydrogen and/or nitrogen is performed by hollow cathode discharge, which may be switched on and off rapidly, namely e.g. so as to switch from off conditions to stable on conditions in less than 1 sec., the addressed treatment in activated hydrogen and/or nitrogen or even more generic in activated gas becomes most challenging as a more general surface treatment process before a further treatment is applied to the then gas-, especially hydrogen- and/or nitrogen-enriched surface.

Thereby, in a first preferred embodiment the method according to the invention further comprises additionally activating a further gas containing oxygen by a plasma discharge and exposing the first surface to said further gas at least one of before and of after the exposing of said first surface to the activated gas, especially containing at least one of hydrogen and of nitrogen. Thereby, pre-exposing the first surface to activated oxygen may be applied to asher contaminants upon the said first surface to be exposed afterwards to the conserving treatment in hollow cathode discharge activated hydrogen and/or nitrogen. Performing treating of the first surface in activated oxygen after having been enriched especially with hydrogen and/or nitrogen allows e.g. improved oxidation of the first surface as of a metal material.

In a further preferred embodiment of the method according to the present invention the hollow cathode discharge is supplied electrically by AC, thereby further preferably by Rf energy. This in spite of the fact that it is also possible to supply the hollow cathode discharge by DC, but AC and especially Rf feed, i.e. in a frequency range above 1 MHz is clearly preferred. In a further preferred embodiment of the method according to the present invention the gas which contains by preference at least one of hydrogen and of nitrogen is activated by one or more than one hollow cathode discharge generated plasma beams. By applying more than one hollow cathode discharge generated plasma beam it becomes possible to simultaneously treat, according to the method of the present invention, a multitude of device surfaces as of a workpiece batch or to treat extended surfaces of devices both most homogeneously.

In a further preferred embodiment of activating gas, thereby especially the hydrogen and/or nitrogen containing gas by more than one hollow cathode discharge generated plasma beam, said more than one beam is generated by one or by more than one hollow cathode discharge. When generating multiple-plasma beams by one hollow cathode discharge the discharge arrangement and its electrical feed is relatively simple, as only one hollow cathode discharge is to be generated, wherefrom multiple-plasma beams are retrieved. Nevertheless, density distribution of the thus generated plasma beams is more difficult to control than in the second and preferred case, where more than one hollow cathode discharge is exploited to generate multiple-plasma beams. In an extreme of this latter approach, which is preferred, at least some of the multiple-plasma beams are separately generated by their respective hollow cathode discharges.

As was mentioned, in a preferred embodiment the addressed first surface is treated before or after being treated in activated hydrogen and/or nitrogen by plasma discharge activated oxygen of a further gas. In spite of the fact that this plasma discharge may be realized by any known type of discharge, in a preferred embodiment this further gas containing oxygen is activated by a hollow cathode discharge, possibly even the same which is used also for activating the hydrogen and/or nitrogen containing gas. Thereby, only the type of gas fed to the treatment process is changed, and if necessary the hollow cathode discharge may thereby be switched off and on.

In a further preferred embodiment of treating the first surface before and/or after treatment by activated hydrogen and/or nitrogen, a further gas activation, especially of oxygen, is performed at a location remote from the location, where surface treatment is performed by activated hydrogen and/or nitrogen. Thereby, in a preferred mode, the further gas containing oxygen is activated by a hollow cathode discharge there too.

Again, if more than one device surface shall be treated simultaneously or such surface to be treated is extended, it is proposed preferably to activate the further gas containing oxygen by more than one hollow cathode discharge beam.

In a further preferred embodiment of the method according to the present invention the gas contains hydrogen, preferably at least to a predominant amount with respect to nitrogen, and there is generated the enrichment of the first surface at least predominantly as a hydrogen enrichment.

In spite of the fact that performing a treatment of the first surface before and/or after treatment in activated hydrogen and/or nitrogen is preferably and with primarily importance performed by treatment in activated oxygen, more generically it is also within the preferred range of the present invention to perform at least one of before and of after generating the enrichment, especially with at least one of hydrogen and of nitrogen, a further treatment of the first surface, which comprises activating a different gas by a hollow cathode discharge beam and exposing the first surface to such activated different gas.

The ability of rapid on and off switching of the hollow cathode discharge is most generically of high advantage for industrial processing, as especially in context with multi-step-processing.

It has been recognized that most advantageously the first surface of first material is exposed to ions of gas, especially of the at least one of hydrogen and/or of nitrogen, which have a maximum ion energy of at most 30 eV, preferably of at most 20 eV. Further, it has shown that it is preferred to generate a plasma for said activating with a plasma potential $U_p$, for which there is valid:

$$10\ V \leq U_p \leq 100\ V.$$

It must be emphasized that the following advantages additionally to the advantage of rapid on and off switching capability are reached by gas activation by means of hollow cathode discharge:

Low ion energy treatment of the surfaces is reached.

There is reached a high degree of dissociation of gas species to be activated as of hydrogen and/or nitrogen, oxygen, to atomic H, N, O of up to 1%.

As was mentioned above and linked to the rapid switching on and off ability, it becomes possible to realize such process or method within a timed plant with inlet/outlet loadlocks. Thereby the parts or devices treated may be kept stationary during at least the addressed process and a further process.

Apparatus, wherein the parts or devices are treated by hollow cathode plasma-activated gas species as especially hydrogen and/or nitrogen or oxygen, may easily be electrically supplied just with one Rf electrical supply, e.g. operating in the MHz frequency range, especially in the customary 13 MHz range at a low plasma potential, as mentioned above, in the range of 10 to 100 V.

Due to optimum switchability of hollow cathode discharge and thus of the treatment by hollow cathode discharge-activated gas species as especially by activated hydrogen and/or hydrogen or oxygen there is reached a very good ratio of treatment times to total cycle times (duty cycle), e.g. up to 70%.

Coupled to the advantage just mentioned there results high throughputs making such processing highly economic.

Due to the fact that hollow cathode operation is done at relatively high operating pressures of $10^{-2}$ mbar to 1 mbar there is no need to provide expensive pumping down to low vacuum pressure values. Significantly less expensive and simpler pumps may be provided for evacuating to processing pressure. A pre-pump, which evacuates the processing area only down to a mbar range vacuum, thus preferably down to 0.1 to 0.2 mbar, is absolutely sufficient.

Gas feed to the process area is performed in that gas with hydrogen and/or nitrogen and possibly of oxygen is supplied into the cathode or cathodes of the hollow cathode plasma source or sources via a gas distribution arrangement. The respectively generated at least one plasma jet or beam as known to the skilled artisan leaves the hollow cathode source through at least one outlet opening directed towards the surfaces or the surface to be treated. In the literature, such processing is referred to as "remote" or "downstream" processing. Such outlet opening forms pressure stages leading to a pressure ratio K from pressure in the hollow cathode to pressure in the processing area of $2 \leq K \leq 10$. Thus, by inletting the gas into the source and e.g. to a pressure therein of $P_s=1$ mbar there is automatically reached by the pressure stage effect of the said opening a processing pressure of about $P_{s/K}=0,1$ mbar. In opposition thereto, when a low-voltage DC discharge with a thermionic cathode is used, high-vacuum pumps should be used for pumping down the processing area as there typical working pressures of less than $10^{-2}$ mbar have to be reached.

Compared to customary treatment times of approx. 10 to 15 min., with the single or multiple hollow cathode beam processing typical operating times of at most 1 min. are reached.

These are significant advantages of multiple hollow cathode application or even of single hollow cathode application (if there is no need of batch or large surface treatment).

Turning back to further preferred embodiments of the present invention: In a preferred embodiment of the method according to the present invention applying a further treatment to the enriched surface comprises applying a second material upon said first surface. Thereby, in a still further preferred embodiment, the applying of the second material comprises depositing a layer of the second material.

The addressed first and second materials may be the same materials or may be different materials.

Besides of applying the second material by layer deposition, a further most preferred embodiment comprises applying the second material by bonding a second surface of a second part to the first surface.

A most preferred embodiment of the manufacturing method according to the present invention comprises exposing the first surface with the enrichment of hydrogen and/or nitrogen to ambient air before performing the further treatment, especially before applying of the second material. Applying the second material may thereby be performed directly, i.e. without first cleaning or even more general first performing an additional surface treatment.

In a further preferred embodiment the further treating comprises applying a second material by bonding a second surface of a second part to the first surface of the first part by ultrasonic welding.

In a further preferred embodiment this bonding is performed by soldering or by gluing.

In a still further preferred embodiment of the manufacturing method according to the present invention, exposing of the first surface of the first part to the activated hydrogen and/or nitrogen is performed in less than 1 min. In a still further preferred embodiment of that method the first material and the second material are metallic.

Thereby, in a still further preferred embodiment the said first part is a metallic coated lead frame.

In a still further preferred embodiment the first part is a semiconductor system carrier.

Still in a further preferred embodiment the first part is a part of a ball grid array and in a still further preferred embodiment is part of a multichip module or of a printed circuit board.

In a further preferred embodiment the material of the first part is one of metallic, metalloid and of plastic. In a further preferred embodiment said first part is a semiconductor substrate carrier constructed of flip chips with soldering points.

In a still further preferred embodiment the first part is a semiconductor system carrier made of ceramic and being coated with a surface protection layer forming said first surface of first material.

In a still further and most preferred embodiment said first material is copper. And still further the first part is a lead frame with said first surface being of copper.

In a still further embodiment of the method according to the present invention applying the second material comprises bonding of a wire to the first surface.

In a still further embodiment of the method according to the present invention the first part is a semiconductor system carrier and the second material is a molded plastic.

In a still further embodiment applying the second material comprises bonding at a temperature of at most 150° C.

In a still further preferred embodiment of the method according to the present invention the first surface with the enrichment is exposed to ambient air before performing applying of the second material and said exposing to ambient air lasts at least one day.

Still in a further embodiment the material of the first surface is at least one of aluminum, gold, copper, nickel, silver and palladium.

Still a further and most preferred embodiment of the method of manufacturing according to the present invention comprises applying the second material by depositing a layer of such material by atomic layer deposition.

The object of the present invention to provide for a manufacturing method, whereat on one hand a plasma activated gas is used and on the other hand the step, whereat such activated gas is used may be easily incorporated into a multi-vacuum-treatment-step manufacturing process is resolved in that such method comprises a) switching on at least one plasma beam generated by a hollow cathode discharge in a gas atmosphere;

b) introducing at least one part of the device into the said atmosphere;

c) treating said part in said atmosphere;

d) switching off said discharge;

e) repeating steps a) to d) at least twice.

Thereby, in a preferred mode of operating this method there is introduced a further part to be treated after step d) and before repeating a) to d). As was mentioned above, especially the critical switching phase of switching the hollow cathode discharge on up to reaching stable discharge conditions lasts at most 1 sec. Thereby, it becomes possible to increase the duty cycle of a treatment cycle to at least 70%.

Thus, in an even more generic approach there is provided a method of manufacturing a device, which comprises intermittently operating a hollow cathode discharge and thereby treating at least one device. In addition, instead of introducing a further part to be treated after the hollow cathode discharge has been switched off, it is absolutely possible, if necessary, to change within the switched off phase, still with the same part or device exposed, the treatment conditions, as especially to change the gas or gas composition and then to continue treatment still of the same device by switching on the hollow cathode discharge and by activating the different gas. As was noted above, thereby one preferred further gas may contain especially oxygen and the ongoing treatment may be performed in an atmosphere with hollow cathode beam activated oxygen.

BRIEF DESCRIPTION OF THE DRAWINGS

These and further objects, features and advantages of the present invention will become more apparent from the following detailed description of currently preferred embodiments when taken in conjunction with the accompanying drawings wherein.

DETAILED DESCRIPTION OF THE DRAWINGS

Figure 1:
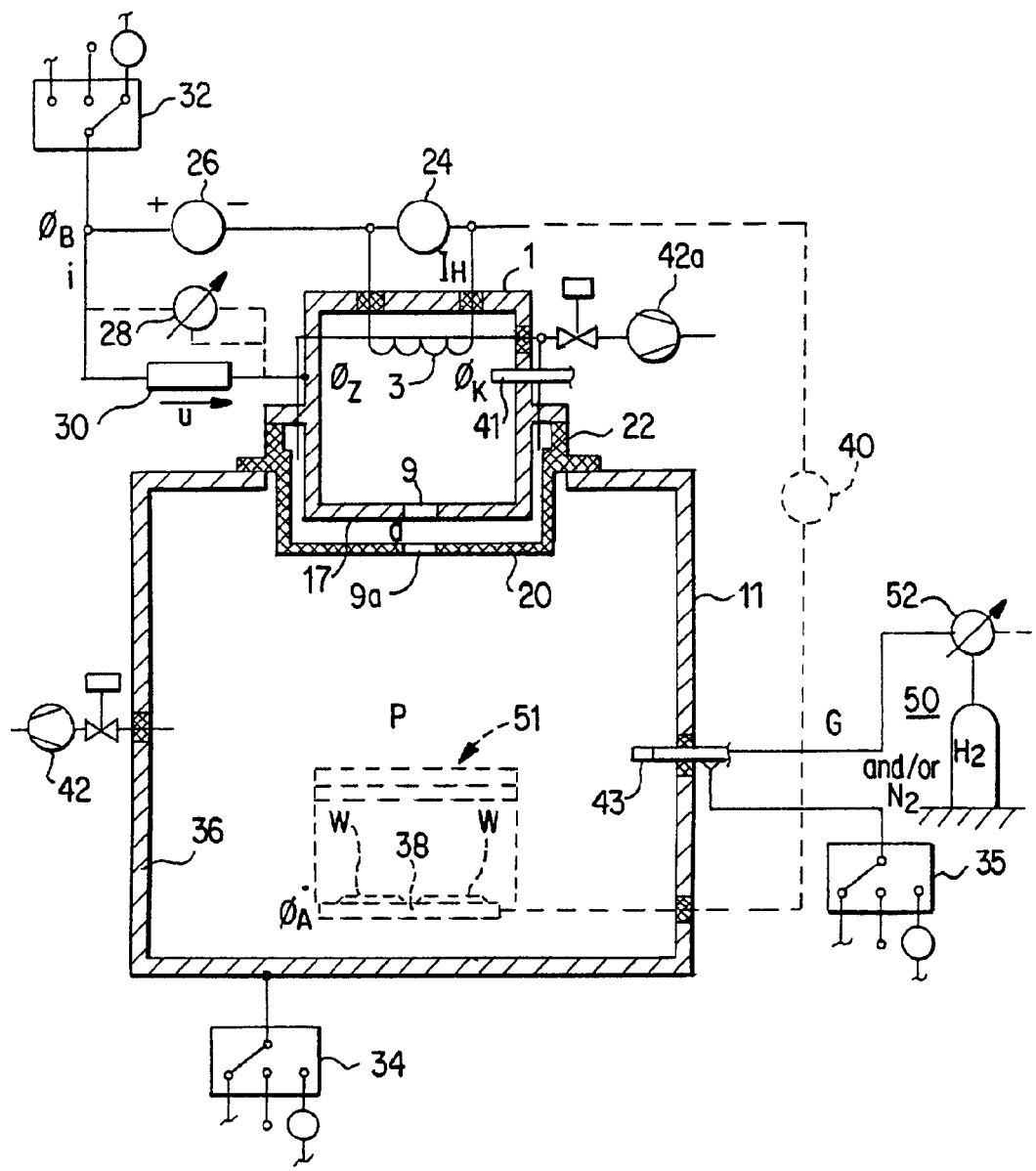
FIG. 1 is a schematic view of a system making use of a DC low-voltage discharge with thermionic cathode, which was used for the hereinafter described tests, which lead to same results as when making use of a hollow cathode low-voltage discharge according to the present invention.

FIG. 1 illustrates a system which generates the same treatment results to be discussed as a system modified according to the present invention. A thermionic cathode 3 for a low-voltage DC discharge is mounted in an insulated manner in a cathode chamber 1. Portions 17 of the cathode chamber 1 frame an aperture 9. The cathode chamber 1 is mounted on the wall of the treatment chamber 11 by way of insulation carriers 22. A screen 20, which is operated in a potential-floating manner with respect to the cathode chamber 1 as well as with respect to the treatment chamber 11, surrounds the portions 17 at a darkroom distance d to directly into the area of the aperture 9. The thermionic cathode is operated by a source 24 with the heating current $I_H$ and is led by way of a voltage source 26 and a unit 28 to at least one portion of the cathode chamber wall, preferably onto the cathode chamber wall itself. The unit 28 acts as a current limiting device and causes a voltage drop u as a function of the current i flowing through it. As illustrated by a dash line, it may be implemented by a current-controlled voltage source, but is preferably implemented by a passive switching element, particularly by a resistance element 30.

The positive pole of the voltage source 26 can be connected to a reference potential, either mass or another defined potential, or may be operated in a potential-free manner, as illustrated purely schematically by the contingency switch 32. Likewise, the treatment chamber 11 is electrically insulated from the cathode chamber 1 and thus, as indicated purely schematically by way of the contingency which 34, can be operated at ground potential, at a reference potential or optionally even in a potential-floating manner. The interior wall 36 of the treatment chamber 11 or at least portions thereof can be switched as an anode with respect to the thermionic cathode 3. However, as illustrated by the dash line, preferably a separate anode 38 is provided, which, by way of a voltage source 40, is anodically, that is, positively wired with respect to the thermionic cathode 3. In this case, the anode 38 is preferably used as a workpiece carrier for the schematically shown workpieces W. By way of a gas feeding line 41, a working gas, such as preferably Argon, is supplied to the cathode chamber. By way of another schematically illustrated gas feeding line 43, as schematically illustrated by way of the contingency switch 35, being connectable to a potential depending on the potential connection of the chamber 11, the hydrogen- and/or nitrogen-containing gas G, preferably hydrogen and/or nitrogen, is supplied. The gas G is admitted through a schematically illustrated valve 52.

A pump arrangement 42 with a high vacuum pump is provided in order to pump down the chamber 11 down to less than $10^{-2}$ mbar and optionally the cathode chamber 1, in which case, as illustrated, additionally a pump arrangement 42a may be provided in order to separately pump down the cathode chamber. The screen arrangement with the aperture 9 acts as a pressure stage between the pressure in the cathode chamber 1 and the pressure in the treatment chamber 11. A diluent gas, such as $N_2$, may be fed to the pump arrangement 42. Thus, a nitrogen flow can be generated which reduces or dilutes the hydrogen to less than 4% by volume in the gas, so that the gas can be discharged into the environment without reservations. There will no longer by any ignitable explosive gas.

The partial pressure of the hydrogen- and/or nitrogen-containing gas G may be maintained to be significantly higher in the treatment chamber 11 than in the cathode chamber 1, which permits a significant increase of the life of the thermionic cathode 3. The wall of the cathode chamber 1 forms the initiating electrode: For igniting the low-voltage discharge, the thermionic cathode 3 is heated by the heat flow $I_H$ for the electron emission, and argon is admitted to the cathode chamber. On the basis of the distance relation between the wall of the cathode chamber 1 and the cathode 3, the ignition of the discharge takes place by the potential connection of the latter, whereupon a current i flows through the unit 28, particularly the resistance 30. Thus, the potential $\Phi_z$ of the cathode chamber wall 17 is reduced which previously was at the ignition value, whereby, during the operation, the wall of the chamber 1 acts as an anode only to negligible extent and the primary discharge is pulled by the arrangement of the screen with the aperture 9 onto the treatment-chamber-side anode 38.

Description of Treatment:

The treatment chamber 11 according to FIG. 1, which was used for the tests to be described, had a volume of

V=60 L.

The workpieces W of the above-mentioned type were introduced into the chamber and the latter is operated as follows;

1. Pumping down to basic pressure of approximately $10^{-5}$ mbar;

2. Activation of the cathode 3 with $I_H$ approximately 150A; Switching-on of the gas flows (hydrogen treatment):
    (a) Argon through line 41, flow $Fl_{Ar}$:
        10 sccm≦$Fl_{Ar}$≦50 sccm,
    (b) hydrogen through line 43,
        flow $Fl_{H2}$: 10 sccm≦$Fl_{H2}$≦50 sccm.
3. After a heating-up time of approximately 10 seconds, ignition voltage was connected between the cathode 3 and the initiating electrode 17. The resistance 30 was selected to be approximately 20 3 and was shunted to the ground. After the ignition of the discharge (ignition voltage approximately 20V to 30V), a discharge voltage between the cathode 3 and the anode 38 occurs of approximately 25V at a discharge current of 40A, while preferably using a welding generator if the recipient wall 11 to the ground is used as the anode 38. Ions with an ion energy of at most 30 eV at the workpiece surface, even preferred of at most 20 eV and activated neutrals are generated of which the typical plasma beaming is an indication. The workpieces to be treated were surface-treated in the thus-generated plasma. The hydrogen-volatile compounds with the contaminations were pumped out by the pump arrangement 42.

The working pressure amounted to:

approximately 6·10$^{-3}$ mbar.

In addition to holding the workpieces at the ground potential, the workpieces may also be exposed to the plasma treatment in a potential-floating manner or connected to a reference potential. Because the potential of the workpieces with respect to the ground potential in the above-described low-voltage discharge is very low (<30V), the problem of the redepositing of material on the workpieces, which occurs during the so-called sputtering, as well as also, in particular, the risk of the destruction of ICs, which are critical with respect to electric potential differences, is excluded. The cleaning and conservation takes place only by way of chemical processes and is caused either by electrons, in the case of correspondingly potential-connected workpieces, or by low-energetic ions and electrons in the case of electrically floatingly workpieces.

The large number of electrons coupled into the plasma ensures a high reactivity of the plasma and therefore short treatment times, which contributes significantly to the economic efficiency of the suggested approach. Another advantage of this process is the tact that the plasma can penetrate even into small hollow spaces. As a result, for example, workpieces can even be treated without being removed from corresponding cassettes or magazines, which is particularly economical.

Figure 2A:
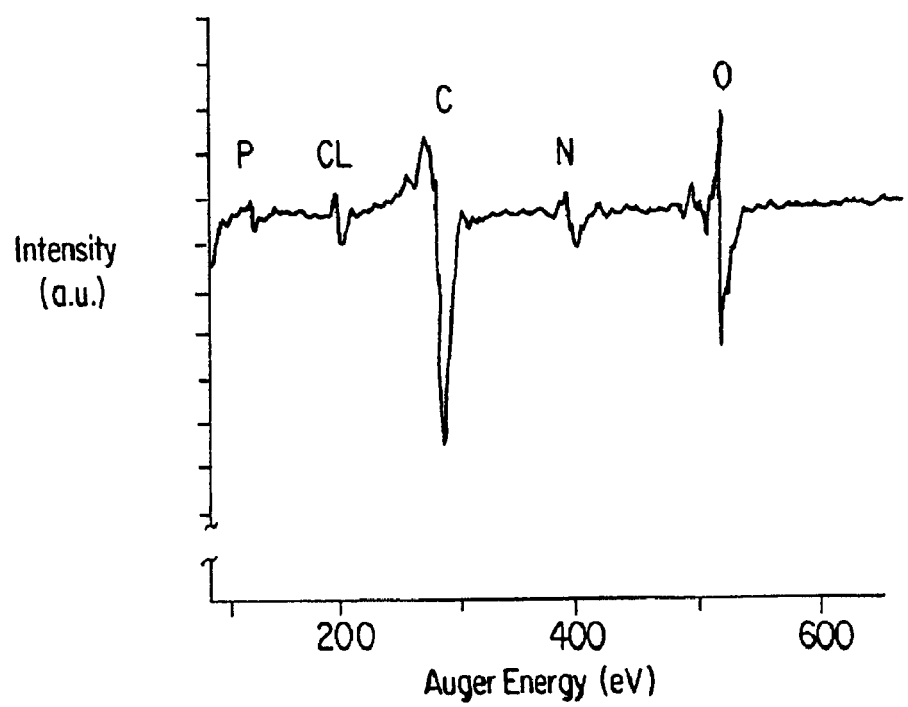
FIG. 2 is a view of the Auger spectrums of two lead frame surfaces of soft solder substrates which originate from the same packaging unit and within which had different distances from the packaging material.
Figure 2B:
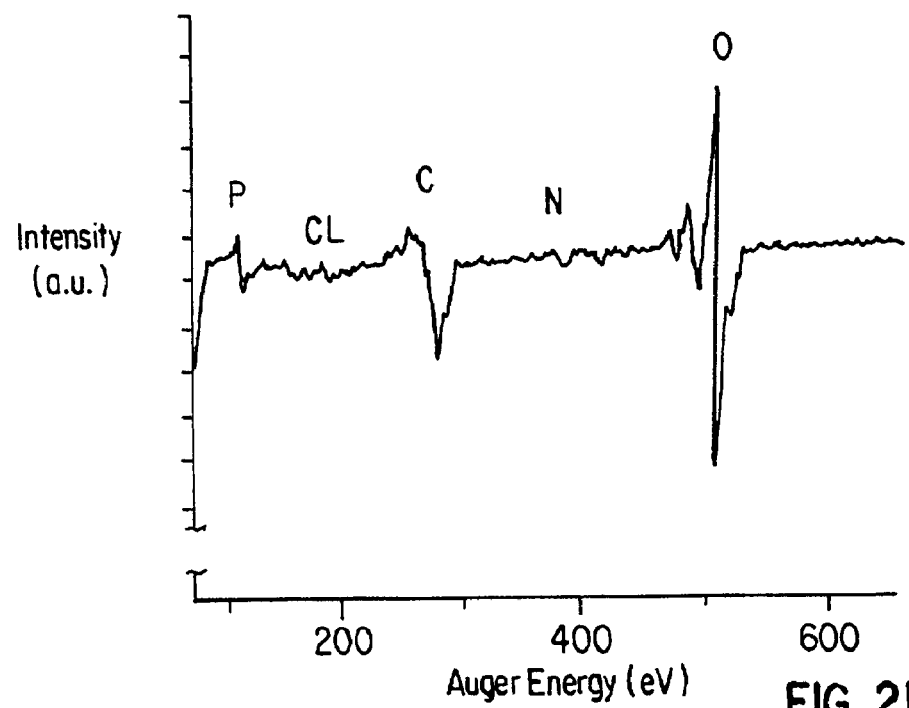

Results:

FIG. 2 illustrates Auger diagrams
  (a) of an untreated lead frame copper surface for a soft-solder bonding after the connection with a packaging material;
  (b) of such a surface within the same packaging unit but not in contact with the packaging material.

The lead frame surface which was in contact with the packaging material (b) is virtually unsolderable because of its high level of contamination.

Figure 3A:
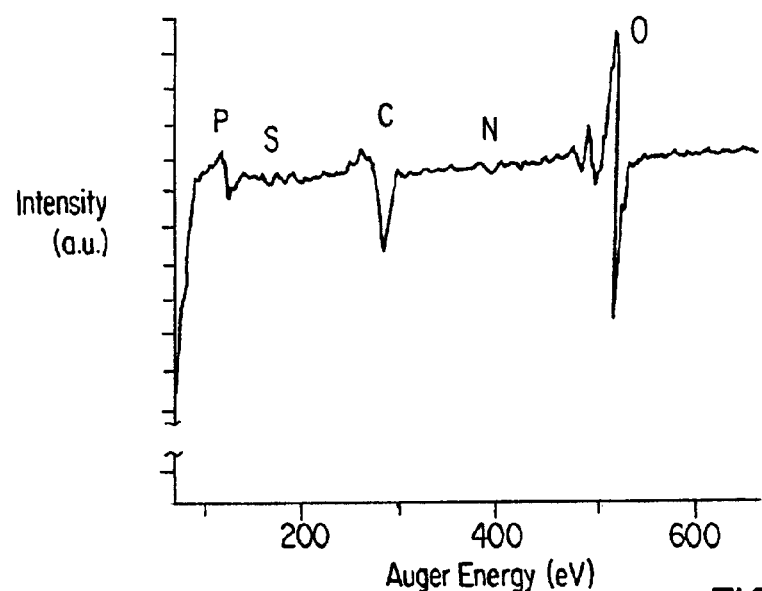
FIG. 3 is a view of the Auger spectrums of surfaces for the establishment of a soft solder connection, in an unpretreated state (a), conserved (b) as well as conserved according to the present invention and then exposed to ambient air (c)
Figure 3B:
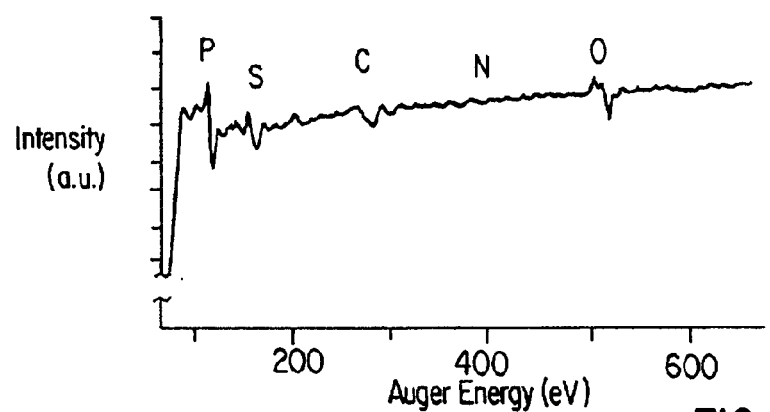

FIG. 3 shows Auger diagrams of
  (a) untreated lead frame surfaces for a soft-solder bonding;
  (b) such surfaces treated according to the above-described approach immediately after their treatment; and
  (c) such surfaces according to curve (b) but after their storage for approximately 1 hour or more in air.

The Auger diagrams illustrate that untreated surfaces, on one hand, and treated surfaces which were then exposed to air, on the other hand, hardly differ from one another.

Although, as illustrated in FIG. 3, the Auger diagrams of uncleaned metal surfaces and metal surfaces cleaned according to the above-mentioned process and then exposed to air again hardly differ from one another, in the case of the latter, the solder wets the lead frame surfaces much better than in the case of uncleaned lead frames, which leads to a more intimate bonding between the semiconductor and the carrier. Quantitatively, this cleaning effect can be illustrated particularly clearly by the good stress results in the case of wire bonding.

Figure 4:
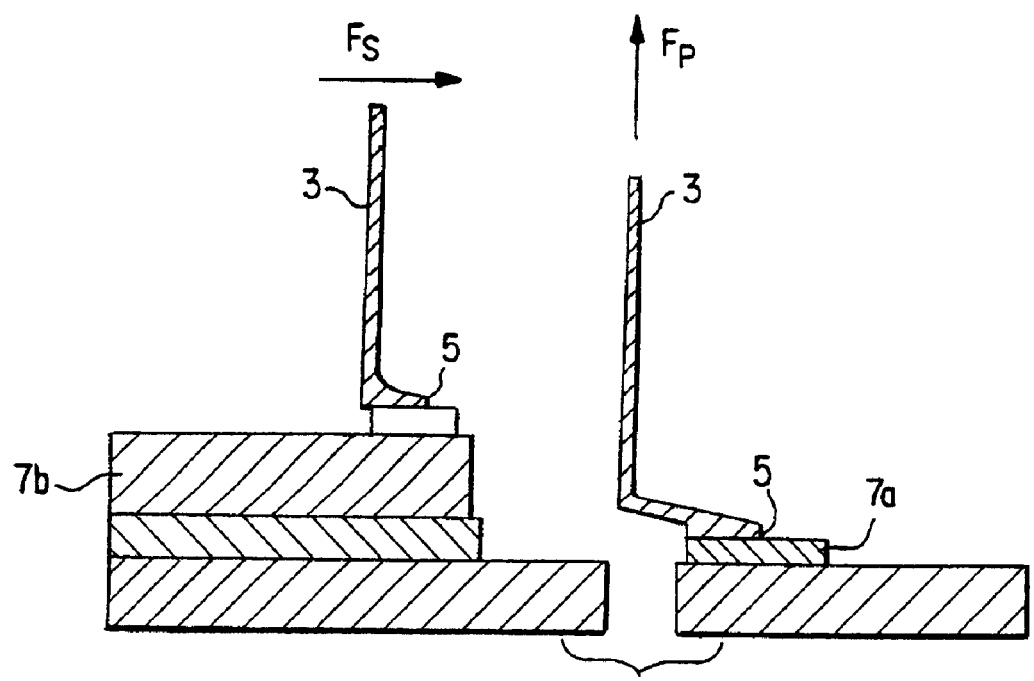
FIG. 4 is a schematic view of the definition of the shearing stress and of the tensile load of wire-bond connection points.

FIG. 4 defines the testing stress for wire bonding. The stressing $F_s$ of a thin wire 3, whose surface is bonded at a connection point 5 with the surface of a lead frame 7a or chip 7b, is called a shearing stress, while the stressing $F_p$ is called a tensile stress.

Further, untreated surfaces of QFP lead frames with silver-plated Cu leads were wire-bonded analogously to (a) of FIG. 3, and such treated surfaces were bonded according to (c) of FIG. 3 were wire-bonded.

Figure 6:
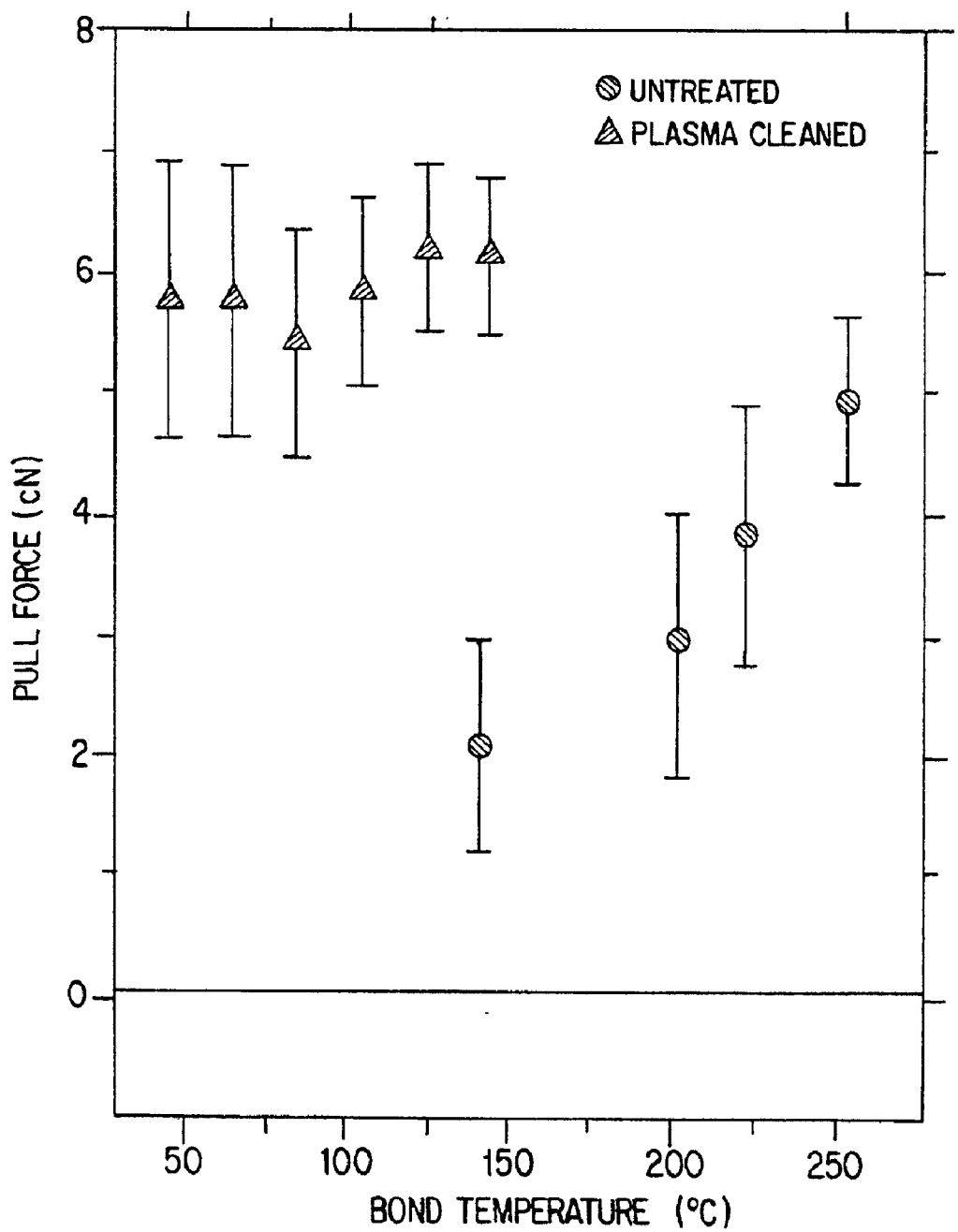
FIG. 6 is a graph of the tensile loadability of ultrasonically bonded, not conserved surfaces as well as of surfaces conserved and stored, as a function of the bond temperature.

As bonding parameters, an ultrasound frequency of 100 kHz and a bonding temperature of approximately 150_C were used (see also FIG. 6).

Figure 5:
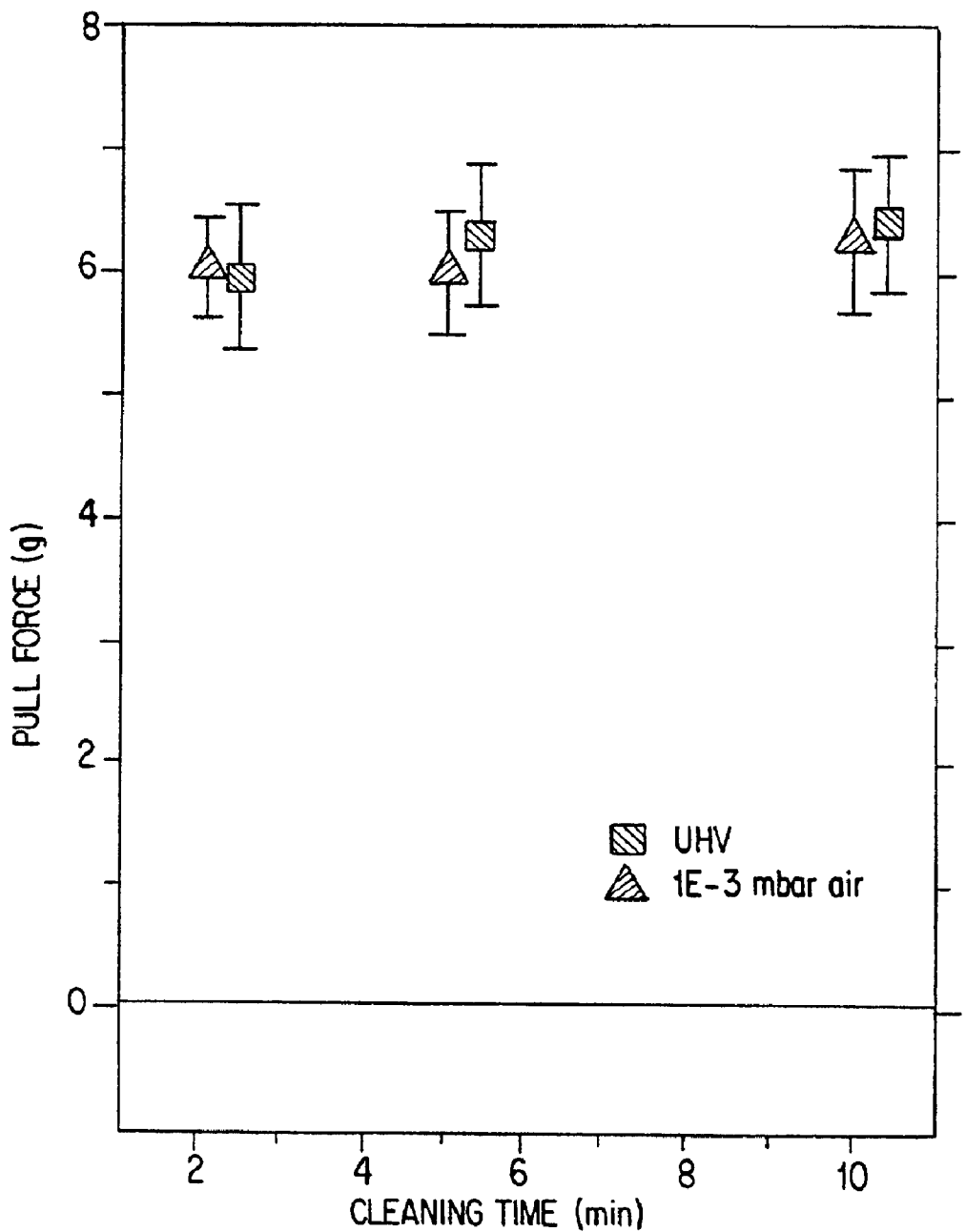
FIG. 5 is a graph of the tensile loadability of surfaces of OFP (quad flat pack) Cu lead frames with silver-plated leads which are conserved according to the present invention, stored in ambient air and then ultrasonically wire-bonded, as a function of the treatment time of surfaces to be connected for wire bonding as well as a function of the pressure during the surface conserving.

While, at these low temperatures, the surfaces according to (a) of FIG. 3 were virtually unbondable, tensile stressabilities according to FIG. 5 were obtained for the surfaces according to (c) of FIG. 3, as a function of the treatment time in the plasma and the initial pressure to which the treatment chamber according to FIG. 1 was pumped down before letting in the gas. This illustrates that the stressability rises only insignificantly as the treatment time increases, whereby even very short treatment times of 2 minutes or less exhibit excellent results.

With respect to the initial pressure, even a pressure increase to, for example, 10$^{-3}$ mbar is shown to affect the tensile stressability only insignificantly, thereby reducing the expenditures for the used system for ultra high vacuum pumps.

FIG. 6 illustrates the tensile stressabilities of the ultrasonically bonded surfaces according to (c) of FIG. 3, as a function of the bonding temperature which was so high that also the untreated surfaces according to (a) of FIG. 3 became bondable. On one hand, significantly lower bonding temperatures are shown to be sufficient for the surfaces treated according to the disclosed technique for achieving much higher tensile stressabilities, compared with untreated identical workpiece surfaces.

Furthermore, the bonding quality of the surfaces treated as described is largely independent of the temperature, which significantly reduces the expenditures for controlling the temperature during the bonding. The fact that low bonding temperatures can be used is particularly important, for example, for ball grid array semiconductor system carriers made of an organic material which must be bonded at low temperatures of ≦150_C.

The bonding temperatures which can be used as of FIG. 6 are significantly lower than the bonding temperatures which are normally used. Currently, it can only be guessed that the treatment according to the present invention causes the conservation in that the metal surface is saturated by hydrogen, that contaminations are precipitated on the surface and virtually float on the hydrogen covering so that their characteristics appear in the Auger diagram, in which hydrogen cannot be detected or can be detected only indirectly and with difficulty, after being exposed to air, virtually as if they were not cleaned but, for the bonding or connecting, as if they were subjected to a high-quality cleaning. When supplying connecting energy, such as ultrasound during bonding, the conserving hydrogen connections are obviously slightly broken open and the pure metal surface is exposed for the bonding.

Figure 3C:
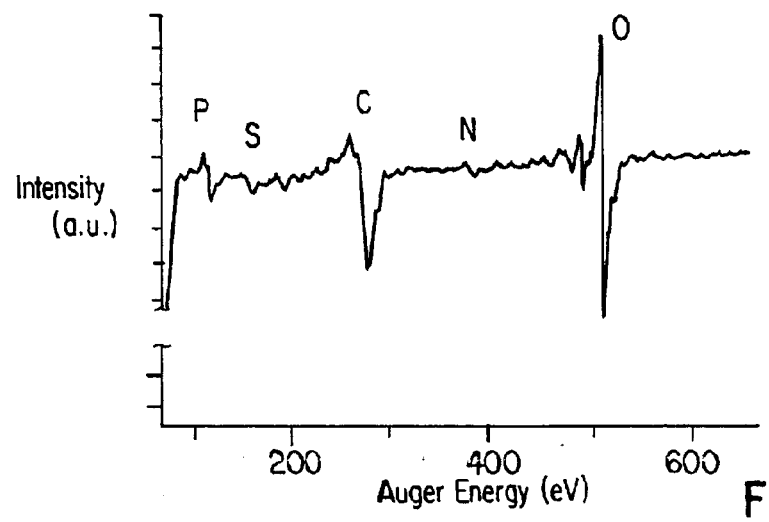

The diagram according to FIG. 3(c), together with the high-quality connectability according to FIGS. 5 and 6, characterize the surface pairs conserved in contrast to pairs according to FIG. 3(a) and their poor connectability according to FIG. 6.

Unconserved semiconductor system carriers exhibited tensile stressing values of the bonded wires of less than 5 cN, while values of above 6 cN could be observed for those which were surface-conserved. In most cases, the wire tore before there was a tearing of the connection point.

Furthermore, the surface treatment in activated hydrogen has been discovered to have an extremely favorable effect for the connections to be established also for the other above-mentioned steps during the packaging process of integrated circuits. Also in semiconductor system carrier materials on a plastic basis, it was found that, after the molding, the molded mass adheres only insufficiently to the semiconductor system carrier, but according to the conserving-pretreatment in activated hydrogen, particularly in plasma-activated hydrogen, an intimate bonding is achieved of the molded mass and the semiconductor system carrier surface cleaned in activated hydrogen. Here also, the conservation effect of the treatment with activated hydrogen can be observed. That is, the treated semiconductor system carriers can still be excellently bonded and molded several days, for example, five days, after the cleaning.

Especially in the industrial application of she method, using nitrogen, a magazine 51 is used as the workpiece carrier 51, as shown in dashed line schematically in FIG. 1. A plurality of substrates to be processed is stacked therein and connected only by insertion slits on the front and/or rear for the substrates, as well as access slits additionally provided in the magazine wall. The communication openings (access slits) between the substrate surfaces and processing chamber P can be much smaller than the dark space distance of the plasma discharge maintained in the chamber. The surface conservation is performed now with a gas containing nitrogen that is activated by the discharge and enters the magazine 51 through the abovementioned openings and slits.

Figure 11:
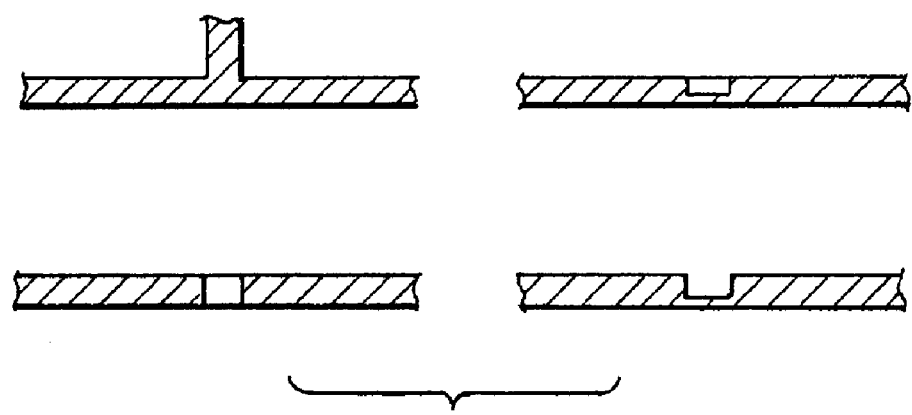
FIG. 11 is a schematic cross-sectional view of areas of substrates that are also suitable for using the method according to the invention.

It is readily apparent that the processing method used is suitable for cleaning surface areas that are difficult of access on workpieces and/or substrates, for example edges, holes, blind holes, grooves, etc., the surface areas subsequently serving for an intimate connection. Such surface areas are shown schematically in FIG. 11.

Again with a chamber like that shown in FIG. 1, the surfaces of connecting workpieces were treated now with gas G containing nitrogen. These were, for example:

(i) metal lead frames for soft soldering, for example made of copper, nickel-plated copper, and silver-plated copper;

(ii) organic HLST materials, such as BGA ("ball grid arrays") and MCM ("multichip modules"), for example on an epoxy or ester basis, a well as PCBs, ("printed circuit boards");

(iii) metallic QFP ("quad flat packs"), for example made of copper, silver-plated copper, or palladium-plated copper;

(iv) the metallization of the traces for the organic HLST materials and the QFP, for example made of silver-plated copper, gold-plated copper, or gold;

(v) semiconductor substrate carriers designed as flip chip with soldering points made for example of AgSn, PbSn, PbSnAg, and PbInAg;

(vi) HLST materials on a ceramic basis, for example aluminum oxide;

(vii) surface protecting layer of the chips, for example made of silicon nitride, silicon oxynitride, and polyimide; and (viii) directly bonded Si—Si wafers.

Description of Processing:

The processing chamber according to FIG. 1 which was used for the subsequent tests to be further described had a volume of $$V=150 \text{ litres}$$

The workpieces of the type described above were placed in the chamber and the operation was as follows:

1. Pumping down to a basic pressure of approximately 10*mbar;
2. Activation of cathode 3 with $I_H$ approximately 190 A;
   2.1 Argon/hydrogen plasma (reference test)
      Discharge current: Test I: 50 A
      Test II: 60 A
      Argon flow: 20 scam
      Processing time: Test I: 10 minutes
      Test II: 10 and 20 minutes
   2.2 Pretreatment in argon plasma (2d reference example)
      Discharge current: Test I: 50 A
      Test II: 60 A
      Argon flow: 20 scam;
      Processing time: Test I: 10 minutes
      Test II: 10 and 20 minutes.
   2.3.2 Treatment according to the invention (combination of nitrogen and hydrogen).
      Discharge current: Test I: 50 A
      Test II: 60 A
      Argon flow: 20 sccm
      Nitrogen and hydrogen flows: total 20 scam, 4 vol.% hydrogen
      Processing time: Test I: 10 minutes
      Test II: 10 to 20 minutes
   2.4 Pretreatment according to the invention ($N_2$ only).
      Arc current: Test I: 50 A
      Test II: 60 A
      Argon flow: 20 sccm
      Nitrogen flow (pure): 20 sccm
      Processing time: Test I: 10 minutes
      Test II: 10 to 20 minutes.

In all tests, following a heating time of the thermionic cathode that was about 30 seconds (switch on time), with a heating current of approx. 190 A, an ignition voltage between cathode 3 and ignition electrode 17 (see FIG. 1) was applied. Resistance 30 was set to approx. 28 ohms and connected to ground. Following ignition of the discharge (ignition voltage approx. 20–30 V) a discharge voltage develops between cathode 3 and anode 38 of approx. 25 V at 50 A discharge current, with preferred use of a welding generator if the recipient wall 11, at ground, is used as the anode.

Ions with an ion energy on the substrates again of at most 30 ev, preferred of at most 20 eV maximum, and excited neutrons are generated for which the typical plasma glow is an indication. The workpieces to be processed in the magazines were surface-treated in the plasma thus produced. The nitrogen and, if additionally provided, the hydrogen-volatile compounds with impurities were pumped off by pumping system 42 with high-vacuum pump.

The working pressure was approximately $5 \times 10^{-3}$ mbar.

As shown in FIG. 1 in dashed lines, now magazines 51 were used that had access slits widths ranging from 1 mm to 10 mm.

Instead of the magazine and hence the workpieces being placed at ground potential, the latter in particular (set to floating potential or to a different reference potential) are exposed to the plasma processing. If the workpieces are operated on floating potential they assume the plasma potential $U_p$ of the plasma, preferably being in the range 10 V $\leq U_p \leq$ 100 V. Thereby, both the problem of redeposition of material on the workpieces as occurs in so-called free sputtering, and also in particular the danger of the destruction of integrated circuits that are critical with respect to electrical potential differences can be ruled out. Cleaning and thus conservation takes place solely by chemical processes which are effected either by electrons, with workpieces suitably connected to potential, or by low-energy ions and electrons in workpieces that are operated at floating potential. This is independent from whether hydrogen and/or nitrogen is used.

The high plasma density of the plasma ensures thereby a high reactivity of the plasma, and hence short processing times, which is critical for the economy of the proposed method. Another advantage is that the plasma penetrates small hollow spaces especially in the magazine shown. Thus for example workpieces can be processed without removing them from the cassette or magazine shown here, which is especially economical.

Figure 8:
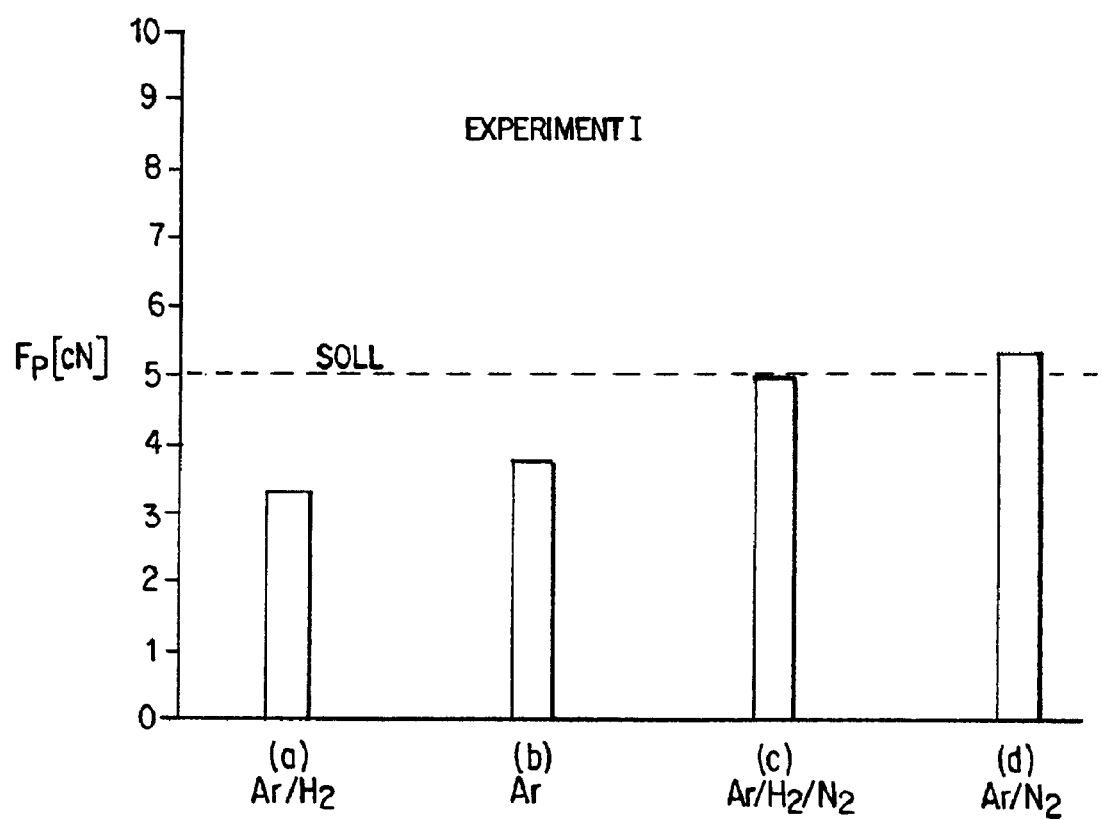
FIG. 8 is a graph showing the results of tensile stress capacity tests ("pull strength"), performed as indicated with reference to FIG. 4, with (a) hydrogen-argon plasma processing, (b) argon plasma processing, (c) treatment in an $Ar/N_2/H_2$ plasma, and (d) processing in an argon/nitrogen plasma.

The following results were realized when PBGA-HLST as well as "lead frames" with copper surfaces were nitrogen processed as workpieces for subsequently producing soft-soldered connections:

Results:

FIG. 8 presents the tensile strength results. The tensile strength and pulling force $F_p$ of the intimate connections were measured on the PBGA-HLST processed according to the invention, the connections being produced by gold wire bonding. FIG. 4 shows this procedure schematically. 5 indicates the connecting point with the surface of a "lead frame" 7a treated.

The surfaces of the treated substrates had previously been treated by the manufacturers in unknowable ways. Following the pretreatment, the detrimental redeposition from the gas phase and/or plasma polymerization on the surface might occur.

On the substrates not subjected to further treatment, obtained directly from the manufacturers, no "wire bonding" connections were made. The resultant tensile strengths are shown in FIG. 8 for Experiment I. The treated substrates are substrates that are unsuited for an argon/hydrogen plasma treatment but are suited for argon/nitrogen plasma treatment: the feared redeposition from the gas phase and/or plasma polymerization did in fact occur during argon/hydrogen plasma treatment, which results in relatively poor tensile strength results (a).

A tensile strength of approximately 3.3. cN was measured. With treatment in argon plasma, slightly better results (b) were obtained, with a tensile strength of approximately 3.6 cN.

Definitely better results were measured as the result of treatment in nitrogen, namely in an argon/nitrogen plasma with a low hydrogen component, in the present case approximately 4 percent according to (c) and in argon/nitrogen plasma according to (d).

In the substrates treated in nitrogen, tensile strengths of approximately 5 cN (c) or far more than 5 cN were measured (d).

Basically, specified tensile strengths of 5 cN were usually targeted for the connections described.

Figure 9:
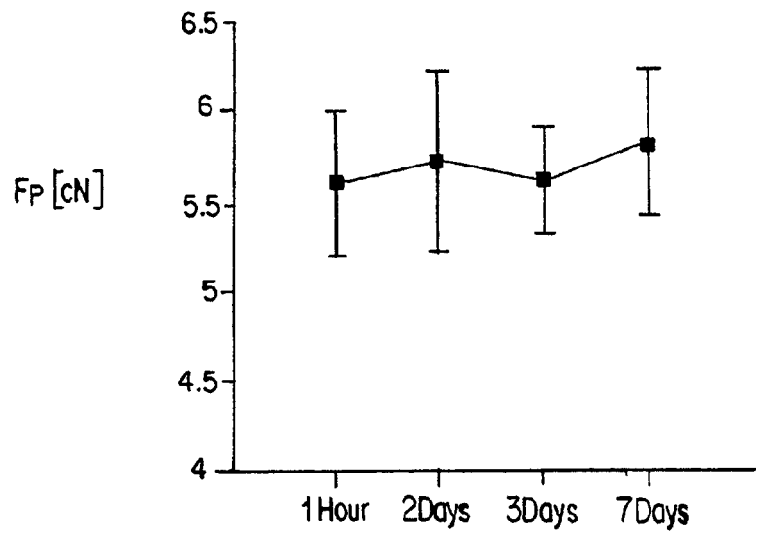
FIG. 9 is a graph, on the basis of a time/pull strength, showing the long-term effect on the plasma processing, and the pull strength of intimate connections formed on workpieces according to the invention.

FIG. 9 shows the long-term effects of the conserving effect for substrates which, as just described, were treated in an argon/nitrogen/hydrogen plasma.

The tensile strength $F_p$ is reduced, and the storage time of the treated substrates in air up to the preparation of the "wire bondings".

It turns out that the measured tensile strength values remain unchanged within measurement accuracy for seven days, in other words there was no re-contamination of the surfaces exposed in the plasma processing procedure.

Figure 10:
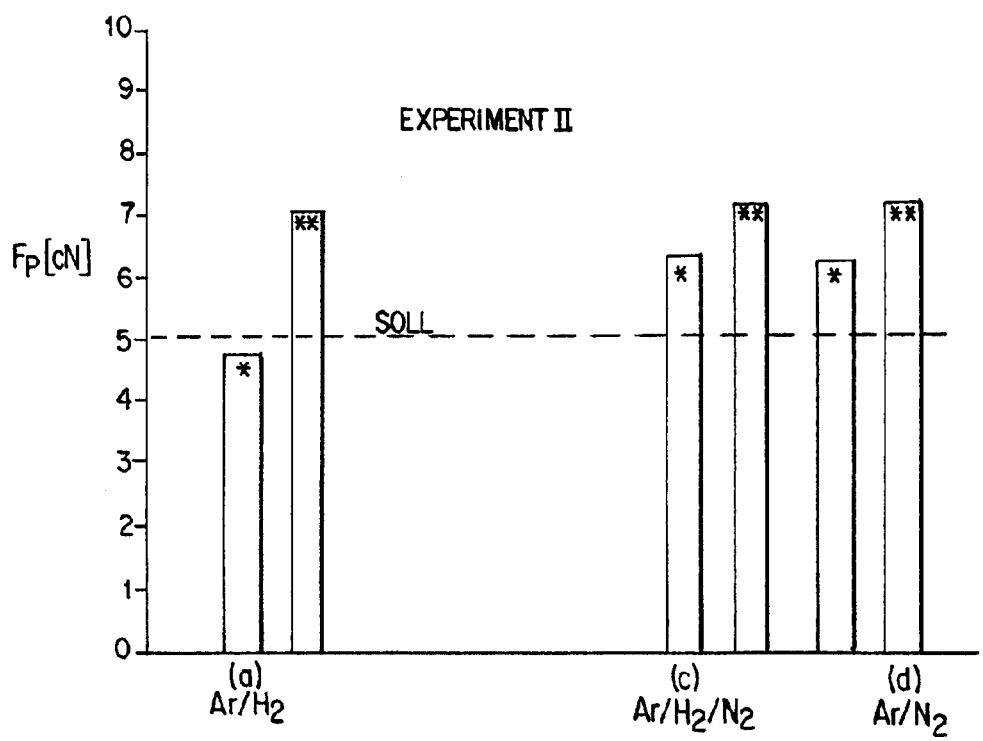
FIG. 10 is similar to FIG. 8 but shows the results of additional pull strength tests.

FIG. 10 shows the results of Experiment II by analogy with the tests according to FIG. 8. The results marked "*" were obtained with a 10-minute nitrogen-treatment, while those marked "**" were obtained with a 20-minute nitrogen-treatment. The discharge current as mentioned above was 60 A. The tests (a to d) according to FIG. 10 and those according to FIG. 8 correspond. In FIG. 10 the tests on the substrates treated in Ar plasma are not shown but they were much worse than the tests according to (a), in other words in the argon/hydrogen plasma.

From this it is clear that despite a higher discharge current as compared with Test I, with a 10-minute processing in argon/hydrogen plasma (a), the required 5 cN tensile strengths were still not reached. For the plasma processing according to (c) and (d) however they have, even with the abovementioned 10-minute treatment at 60 A arc current, far above the target value, namely approximately 6.5 cN (c) and 6 cN (d). Thus, similarly good results can be obtained in argon/hydrogen plasma only by lengthening the processing time. This involves a higher thermal load on the substrates, and with a longer processing time undesired effects can occur on substrates with different additional material surfaces. While in substrates treated according to (c) and (d) in nitrogen, no problems occurred in the subsequent molding process, in the substrates (FIG. 10) processed according to (a) a partial delamination of the molding material was observed. This indicates that with respect to materials that were used, the processing method employing nitrogen has a wider processing window than employing hydrogen.

It is also important to note that the tensile capacity tests presented in FIG. 10 were performed on substrates five days after their plasma processing in nitrogen, while Tests I according to FIG. 1 result during bonding on the same day on which the plasma processing was performed.

Figure 7:
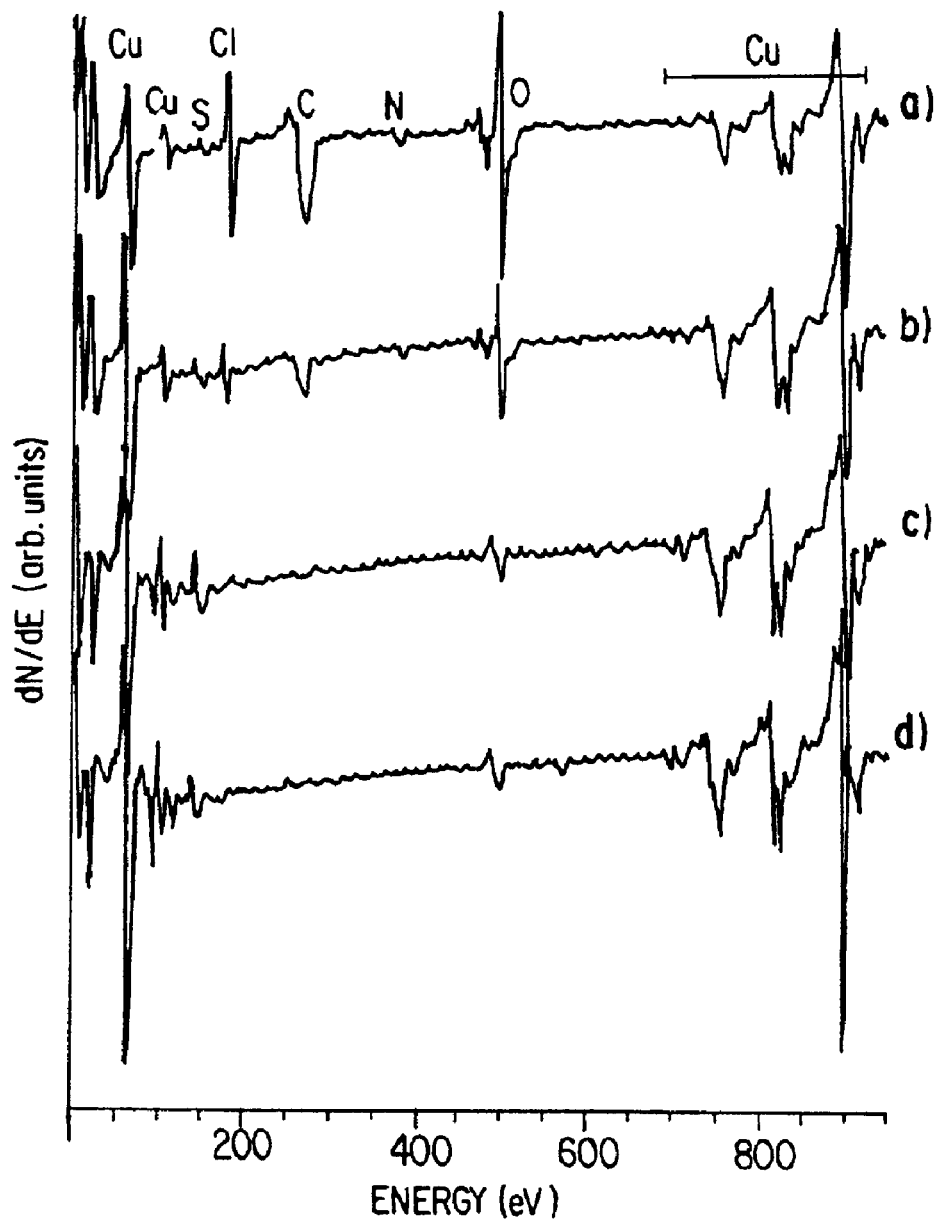
FIG. 7 shows the Auger spectrum of copper surfaces ("lead frames") for producing a soft-soldered connection.

In FIG. 7, finally, the Auger spectra of copper surfaces ("lead frames") for producing a soft-soldered connection are shown.

Spectrum (a) was recorded on a "lead frame" not treated according to the invention.

Spectrum (b) was recorded following a 2-minute pretreatment in nitrogen according to FIG. 8, Test I (d), spectrum (c) was recorded following a 4-minute pretreatment of this kind, while spectrum (d) was recorded following a 6-minute pretreatment of this kind. It is particularly the development of the C peak at 271 eV and the N peak at 379 eV and the O peak at 503 eV that demonstrate the cleaning action of the activated nitrogen treatment. The substrates on which the spectra according to FIG. 7 were recorded were treated for the described processing times in argon/hydrogen/hydrogen (4%) plasma. With treatment in argon/nitrogen plasma according to (d) in FIGS. 8 to 10 the behavior relative to C and N remains essentially the same but oxygen is not completely removed from the surface.

As was described in the introductory part of the present application, activating process gases to perform the treatment as was described up to now has the drawback that processing may not be rapidly switched on and off. This due to the fact, with an eye on FIG. 1, that the thermionic cathode 3 necessitates a certain time after having been switched on to reach stable electron-emitting state.

Figure 12:
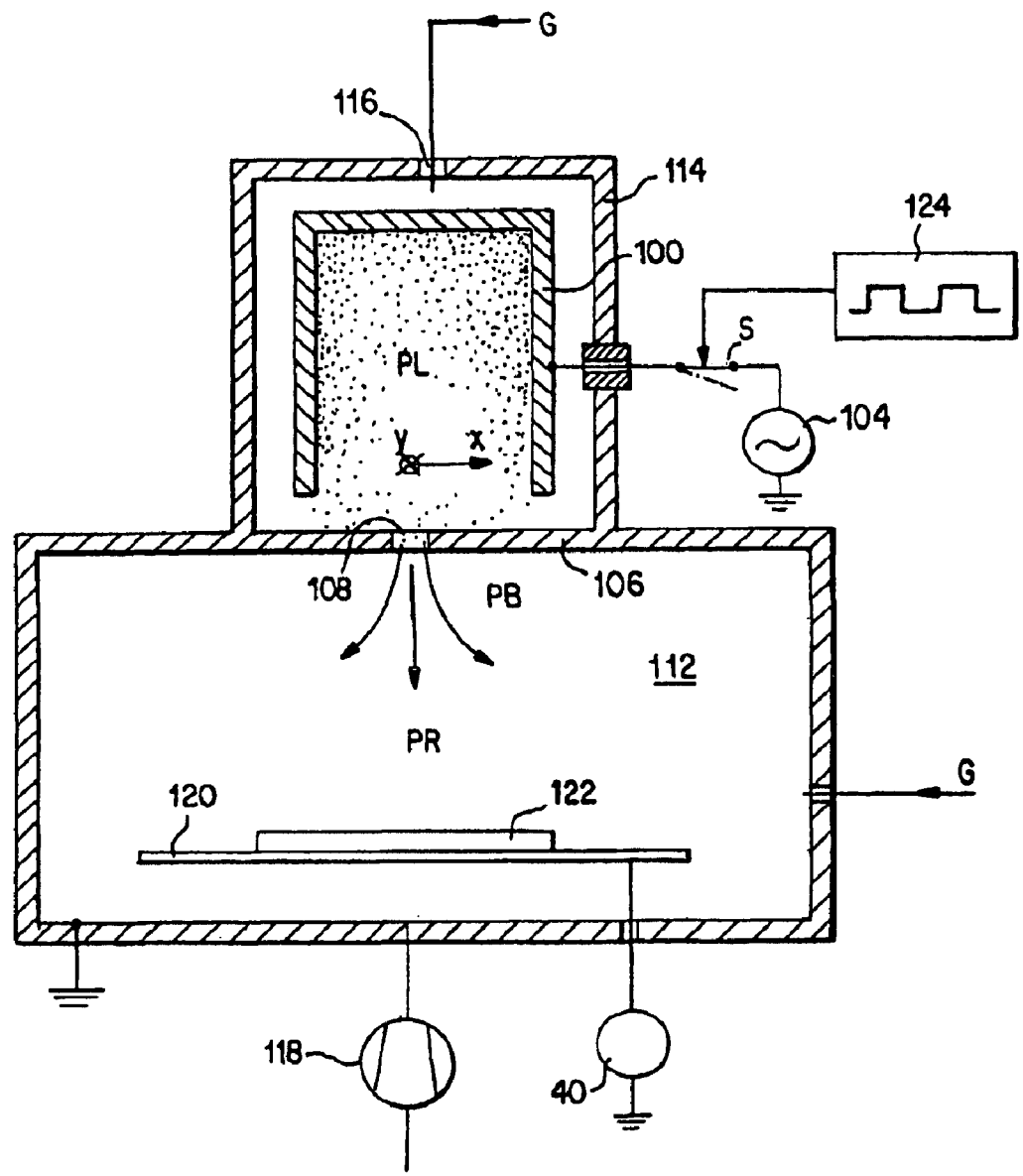
FIG. 12 is a schematic cross-sectional view of a treatment chamber with a hollow cathode plasma jet or beam source as applied according to the present invention.

It is the target of the present invention to further improve processing, so that such processing may rapidly be switched on and off, as it would be desirable in a multi-processing plant, whereat workpieces are subsequently introduced into respective processing stations, treated thereat, removed and vacuum transported to the next processing station, whereas the former processing station is reloaded with workpieces. This target is accomplished principally by activating the hydrogen and/or nitrogen gas by a hollow cathode plasma beam source, and even more generic by activating a process gas by such hollow cathode plasma beam. Such source coupled to a respective treatment chamber to perform processing of workpieces in plasma-activated hydrogen and/or nitrogen or other plasma activated gas, especially containing oxygen, is schematically shown in FIG. 12.

A hollow cathode 100 is preferably operated by means of an Rf generator 104, thereby preferably generating a supply signal at 13, 56 MHz as customary.

The hollow cathode 100 may also be operated at lower frequencies of AC, even down to DC, but it is clearly preferred to operate the hollow cathode 100 above the KHz range and as outlined, especially in the 10 MHz range.

The hollow cathode 100 co-operates with an anode 106, which is electrically isolated from hollow cathode 100 and has a plasma beam opening 108.

The anode 106, for instance operated on reference potential, so preferably on ground potential, forms the wall of a treatment chamber 112 and comprises preferably a screen 114, screening AC-driven hollow cathode 100 from the surrounding and being operated preferably on ground potential too.

A gas G as was formerly described in context with FIG. 1, thereby containing especially hydrogen and/or nitrogen and/or oxygen, as well as possibly a working gas as Argon, is fed by a gas inlet 116, preferably into the hollow cathode. A plasma beam PB is ejected through the opening 108 into chamber 112 enclosing the processing space PR. Thereby, the opening 108 forms a pressure stage so that pressure $K.p_p$ applied within hollow cathode 100 is reduced to a processing pressure $P_p$ within the process atmosphere PR e.g. and preferably by a factor K of 2 to 10. This arrangement is commonly known as "downstream" or "remote" processing.

A processing pressure $p_p$ of about 0.1 to 0.5 mbar is preferably to be set in the processing atmosphere PR. Thus, with K being 10 the pressure in the hollow cathode 100 will stabilize at about 1 to 5 mbar respectively.

Thus, considerably higher vacuums and pressures are to be handled than when performing processing with DC-low-voltage discharge with thermionic cathode. Pumping of chamber 112 as by a pump 118 may be performed with a fore-pump being much simpler and less costly than a high-vacuum pump as is to be applied at 42 of FIG. 1.

Within the process atmosphere PR and by means of a workpiece carrier 120 at least one workpiece 122 is exposed to the plasma beam PB containing plasma-activated gas.

Preferably the workpiece 122 is operated on floating potential. Plasma potential $U_p$ is preferably $$10 \text{ V} \leq U_p \leq 100 \text{ V}.$$

Nevertheless, it necessary and as also shown in FIG. 1, substrates or a magazine with substrates as of 51 of FIG. 1 may be operated at a bias potential set by a biasing source 40. Further and if desired also the anode 106 and/or chamber wall 112 and/or screen 114 may be mutually electrically isolated and driven at respective desired electric potentials.

Instead or additionally to inletting gas G into the hollow cathode 100 or as shown in FIG. 12 between screen 114 and anode 100 it might be desirable to feed such gas G directly into the process atmosphere PR within chamber 112.

Further, in FIG. 12 there is schematically shown a cross-section of a processing chamber according to the present invention and performing workpiece treatment with hollow cathode discharge activated gas G. Thereby, it might appear that there is only provided one opening 108 for ejecting a single plasma beam BP into chamber 112. Nevertheless, the hollow cathode 100 may be extended in the direction y perpendicularly to the plane of the figure, thereby forming a U-shaped profile. Accordingly, there are provided more than one, preferably a multitude of openings 108 fed from such U-profile shaped hollow cathode 100 into chamber 112. Further, more than one opening 108 may be provided in direction x. Thus, by respectively providing an extended hollow cathode 100 especially in direction y as marked in FIG. 12 there may be generated, fed from one single hollow cathode 100, a multitude or at least more than one opening 108 and thus more than one plasma beam BP into chamber 112.

Thereby, the possibility is opened to simultaneously treat more than one workpiece 122 by hollow cathode discharge activated gas or gases simultaneously as batch processing, or to respectively treat the surface of extended large surfaces especially homogeneously.

In all such embodiments the important advantage is reached that gas activation may be switched on and off very rapidly, e.g. with time spans to reach stable discharge when switching on from the off status of less than 1 sec. Therefore, the treatment chamber as shown in FIG. 12, be it for single or more than one plasma beam generation, is switchable on and off if the need be, as schematically shown in FIG. 12 by controlled switching on and off of electric power feed—S— to the cathode 100 by means of a timer unit 124.

When the gas G introduced into chamber 112 and activated by means of the one or more than one plasma beam comprises hydrogen and/or nitrogen, then the surface of workpiece 122 treated with hollow cathode discharge activated hydrogen and/or nitrogen will become conserved as was discussed with respect to FIG. 1, there making use of a DC low-voltage plasma discharge with a thermionic cathode.

The results, which have been reported, when activating hydrogen and/or nitrogen with respect to characteristics of the resultant hydrogen and/or nitrogen enriched surfaces according to the FIGS. 2 to 11, are also valid when instead of the said DC low-voltage discharge with thermionic cathode, a hollow cathode discharge is used for activating the gas species, as was explained with the help of FIG. 12. Additionally with the hollow cathode discharge as was mentioned and as schematically shown by timing unit 124 operating on switch S, rapid intermediate operation of the process of gas activation is reached also and especially for the hydrogen and/or nitrogen containing gas.

As has been explained in context with FIG. 12 one single hollow cathode discharge as a primary plasma discharge may be used to generate, downstream, more than one and up to a multitude of distinct plasma beams.

Nevertheless, exploiting one single hollow cathode primary discharge as of the discharge PL according to FIG. 12 for multiple-plasma beam generation is somehow restricted with respect to the ability of controlling appropriate plasma density distribution throughout the large treatment chamber as of 112, whereat batches of devices or a device with an extended surface are to be e.g. homogeneously treated by activated gas. This drawback is remedied by the preferred embodiment as schematically shown in FIG. 13.

Instead of a single hollow cathode for generating multiple-plasma beams, there is provided a multitude or at least more than one hollow cathode $100_a$ to which, as was explained in context with the embodiment of FIG. 12, a gas G is fed, for conserving surfaces comprising or even consisting of hydrogen and/or nitrogen. Each hollow cathode $100_a$ feeds a respective opening $108_a$ to the chamber 132, thereby generating a multitude of distinct plasma beams $BP_a$ in a predetermined pattern within chamber 132. Although, as shown in FIG. 13, all the hollow cathodes $100_a$ and their respective anodes are fed from one Rf feed and if desired switched on and off as schematically shown with switch S, it is also possible to operate at least some of the hollow cathodes $100_a$ by separate electric feeds so as to allow a desired setting of plasma density distribution throughout chamber 132 by appropriately adjusting the energy fed to the respective hollow cathodes $100_a$. As schematically shown at 134, by such an arrangement it is possible to especially homogeneously treat batches of a multitude of workpieces or (not shown) an extended surface of one or more than one device.

Figure 13:
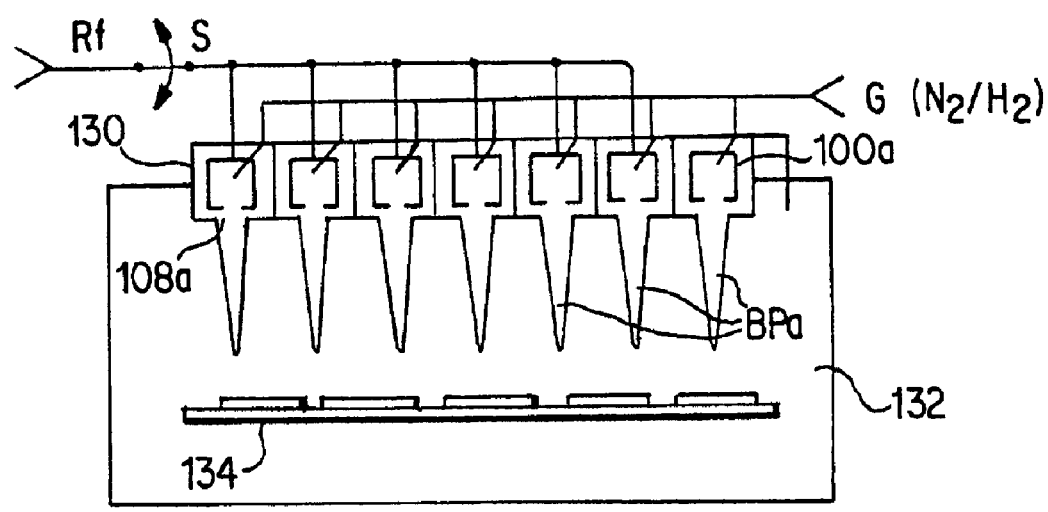
FIG. 13 shows in schematic representation one embodiment of a multiple hollow cathode beam treatment chamber as applied to perform the inventive method under the aspect of large surface or batch treatment and of rapid switching on and off of the process.

Even if all the hollow cathodes $100_a$ as of FIG. 13 are operated from a single electrical feed as shown, a rather improved plasma density distribution in two dimensions is reached within chamber 132 compared with generating multiple-plasma bean from one single primary plasma within one hollow cathode as of FIG. 12. Nevertheless, it is absolutely possible to provide some hollow cathodes, which are feeding one or more than one plasma beam combined with one or more than one hollow cathode as of $100_a$, which by their primary plasma generate only single plasma beams.

Thereby, and with respect to workpiece processing as was disclosed with the help of low-voltage discharge the same results are valid with the additional advantages that there is reached a higher degree of nitrogen and/or hydrogen dissociation. Further switching on and off is easily realized and thus, generically, a most advantageous ratio of treatment times to handling times is realized with treatment times being at least 70% of overall cycle times.

In both embodiments of FIGS. 12 and 13 the ions of activated gas at the surfaces of the workpieces have an energy which does preferably not exceed 30 eV, even more preferred 20 eV, whenever the substrate carriers and thus the workpieces or substrates are treated at floating potential.

Thus, with the arrangement according to FIG. 12 or 13 not only batch processing becomes possible, but additionally it becomes possible to rapidly switch the process and thus plasma activation of the gas G on and off.

Figure 14:
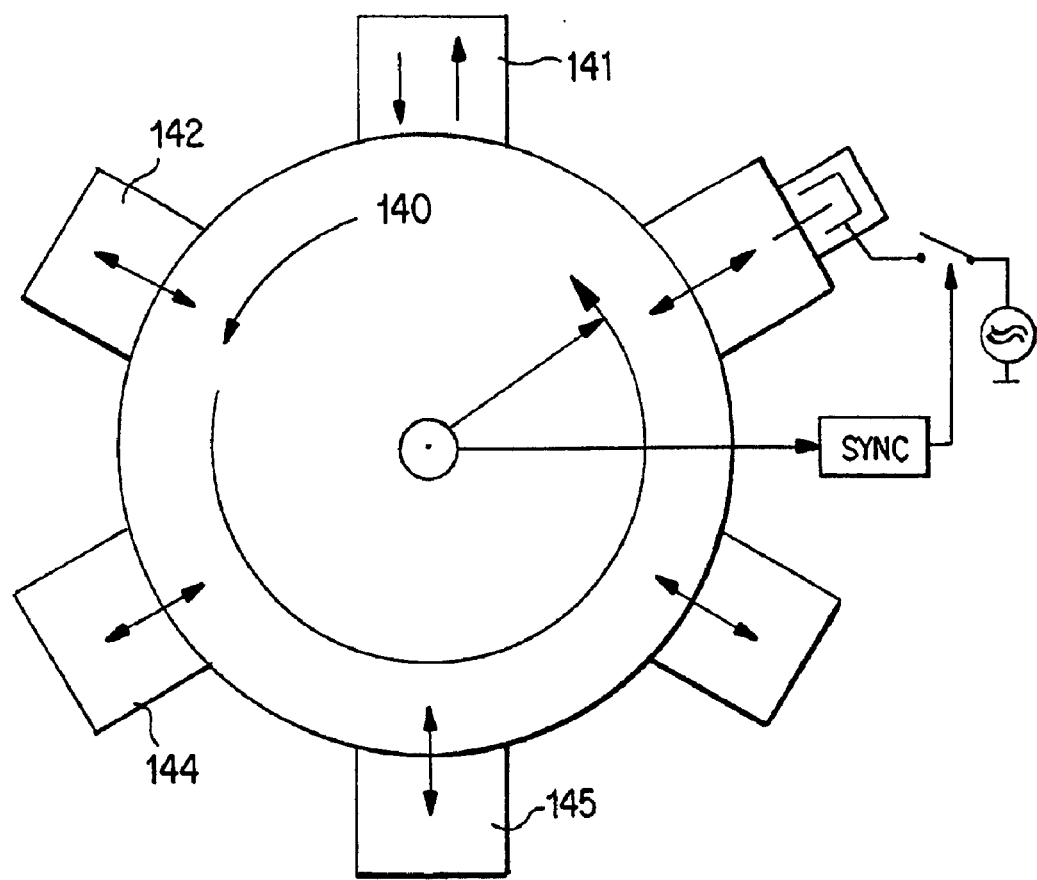
FIG. 14 schematically shows a multi-processing timed vacuum treatment plant, whereat the processing chamber as e.g. of FIG. 13 is integrated, performing thereat one treatment cycle.
Figure 15:
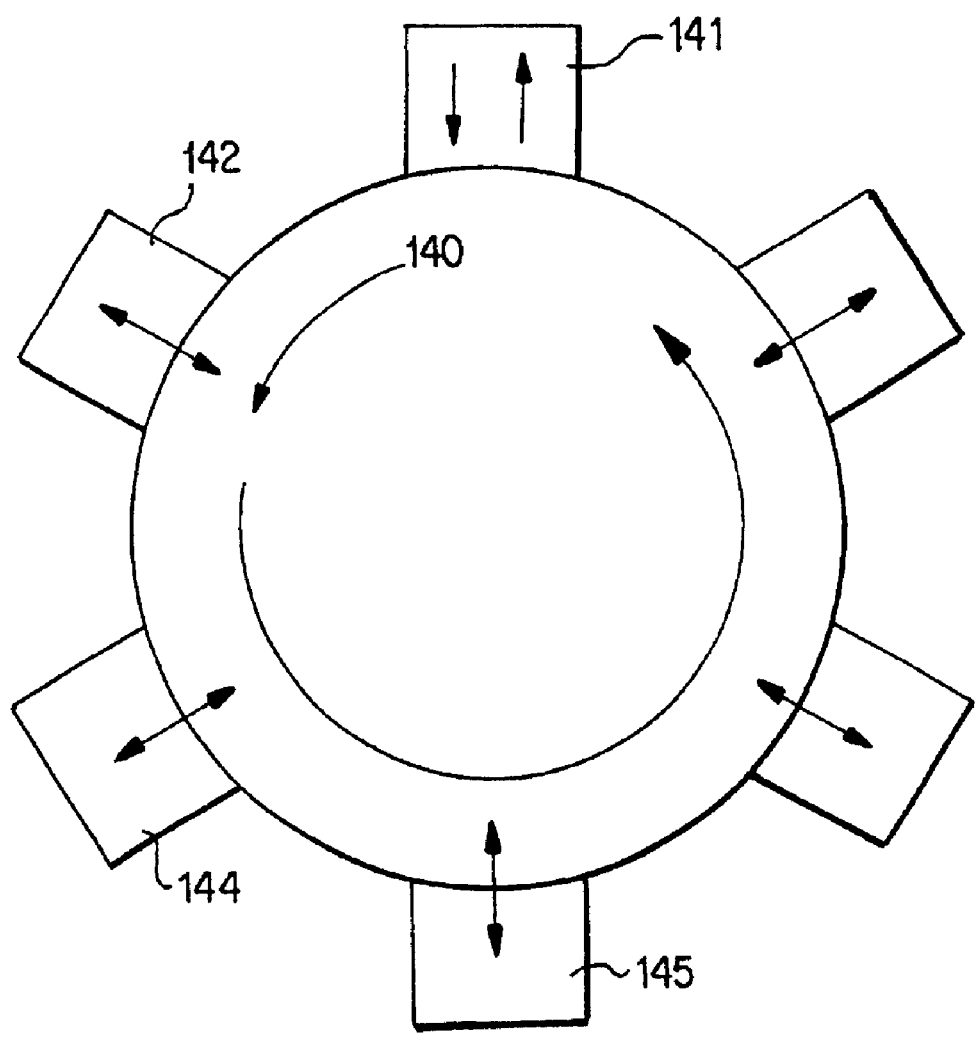
FIG. 15 schematically a further multi-processing timed vacuum treatment plant, whereat at least one processing module is integrated performing treatment according to the present invention.

The important advantage of becoming able to rapidly switch such processing on and off will be exemplified with the help of FIG. 14. Therein, there is shown a vacuum treatment plant with a central transport chamber 140, to which more than one—as shown in FIG. 15 e.g. 6—vacuum treatment stations are mounted. Station 141 is thereby e.g. an input/output loadlock chamber, chamber or station 142 e.g. a station for surface processing as was described in this application, station 144 is e.g. a station for atomic layer deposition, chamber 145 again a chamber according to the present application for surface treatment in plasma-activated hydrogen and/or nitrogen and/or oxygen etc. When a single workpiece or a workpiece batch is to be subsequently treated in the treatment stations grouped around the transport station 140, it is important to adapt the treatment times within such station to each others, because if there is one station, which necessitates considerably longer cycle times than the remainder of such stations, it will be that station considered, which dictates throughput of the plant if there is not installed a relatively complicated parallel processing or intermediate storage of the workpieces.

Whenever a door or valve of station 142 towards the central transport chamber 140 is opened, so as to prevent activated gas to cross-contaminate other processes grouped around such transport chamber 140, it is clearly preferred to switch the treatment process considered off and on again, when the door is closed. Thus switching occurs in the rhythm of feeding and removing workpieces into station 142. Therefore, as an example it might be very important to be able to switch the treatment process as of the present application on and off, which is achieved by single hollow cathode plasma beam application (for single small-surface workpieces) or by multiple plasma beam hollow cathode arrangements for large-surface workpiece treatment or for batch workpiece treatment.

As shown in FIGS. 12 and 13, switching on and off when applying a hollow cathode plasma beam source is realized by simply switching electric power to the hollow cathode on and off.

In the arrangement of FIG. 14, preferably switching of the hollow cathodes is synchronized with the transport movement as schematically shown.

Whereas FIG. 14 shows a vacuum treatment plant, whereat the treatment station as of 141, 142 etc. are supplied with workpieces and with respect to a rotated transport arrangement within central transport chamber 140 in radial direction, it is perfectly clear to the skilled artisan that it is also possible to provide in a central transport chamber a transport arrangement, which rotates controllably around a central axis and from there to feed treatment stations including a loadlock station in parallelism to the rotational axis of the central transport arrangement, i.e. to lift and lower the workpieces from and towards respective treatment stations.

Again with respect to the results of conserving workpiece surfaces by hollow cathode discharge activated hydrogen and/or nitrogen and for large surface devices or batches of devices simultaneously treated the results as were shown in context with the FIGS. 1 to 11 are valid. By the embodiments of the FIGS. 12 to 14 there may be treated in batch operation:

metallic lead frames for soft soldering, made for example of copper, nickel-plated copper, silver-plated copper;

organic semiconductor system carrier materials, such as BGA's (ball grid arrays) and MCM's, (multi-chip modules), e.g. on an epoxy or ester basis, such as PCB's (printed chip boards);

metallic QFP's (quad flat packs), e.g. made of copper, silver-plated copper, palladium-plated copper;

the metallization of strip conductors for the organic semiconductor system carrier materials and the QFP's, e.g. made of silver-plated copper, gold-plated copper, gold;

semiconductor substrate carriers constructed as flip chip with soldering points, e.g. made of AgSn, PbSn, PbSnAg, PbInAg;

semiconductor system carrier materials on a ceramic basis, such as aluminum oxide;

surface protection layers of chips made for example of silicon nitride, silicon oxinitride, polyamide.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of manufacturing a part for further processing comprising:

activating a gas containing at least one of hydrogen and of nitrogen by at least one hollow cathode discharge;

generating at least one plasma beam of said activated gas;

exposing a first surface of a first material of a first part to said activated gas of said at least one plasma beam; and removing said first part from said exposing and storing said first part in ambient air before further processing.

2. The method of claim 1, further comprising supplying said at least one hollow cathode discharge by AC.

3. The method of claim 1, said AC being Rf.

4. The method of claim 1, further comprising generating more than one plasma beam.

5. The method of claim 4, further comprising generating said more than one plasma beam by more than one hollow cathode discharge.

6. The method of claim 1, wherein said gas contains hydrogen.

7. The method of claim 1, further comprising applying a second material upon said first surface after said storing.

8. The method of claim 1, further comprising exposing said first surface to ions of said at least one of nitrogen and of hydrogen with a maximum ion energy of at most 30 eV.

9. The method of claim 8, thereby selecting said maximum ion energy to be at most 20 eV.

10. The method of claim 1, further comprising generating said discharge with a plasma potential $U_p$ for which there is valid:

$$10 \text{ V} \leq U_p \leq 100 \text{ V}.$$

11. The method of claim 7, said applying a second material comprising depositing a layer of said second material.

12. The method of claim 7, said applying said second material comprising bonding a second surface of a second part to said first surface.

13. The method of claim 7, said applying said second material comprising bonding a second surface of a second part to said first surface by ultrasonic welding.

14. The method of claim 7, said applying said second material comprising bonding a second surface of a second part to said first surface by a solder connection.

15. The method of claim 7, wherein said applying said second material comprises bonding a second surface of a second part to said first surface by gluing.

16. The method of claim 1, wherein said exposing is carried out in less than 1 minute.

17. The method of claim 7, wherein said first material and second material are metallic.

18. The method of claim 1, wherein said first part is a metallic coated lead frame.

19. The method of claim 1, wherein said first part is a semiconductor system carrier.

20. The method of claim 1, wherein said first part is part of a ball grid array.

21. The method of claim 1, wherein said first part is part of a multi-chip module.

22. The method of claim 1, wherein said first part is part of a printed circuit board.

23. The method of claim 1, wherein said first material of said first surface is one of metallic, metalloid and of plastic.

24. The method of claim 1, wherein said first part is a semiconductor substrate carrier constructed of flip chips with soldering points.

25. The method of claim 1, wherein said first part is a semiconductor system carrier made of ceramic and coated with a surface protection layer forming said first surface.

26. The method of claim 1, wherein said first surface is of copper.

27. The method of claim 1, wherein said first part is a lead frame and said first surface is a copper surface.

28. The method of claim 7, wherein applying said second material comprises bonding a wire to said first surface.

29. The method of claim 7, wherein said first part is a semiconductor system carrier and applying said second material comprises applying a molded plastic mask.

30. The method of claim 7, wherein applying said second material comprises bonding at a temperature of at most 150° C.

31. The method of claim 1, wherein said storing lasts at least 1 day.

32. The method of claim 1, wherein said first surface is of one of aluminum, gold, copper, nickel, silver and palladium.

33. The method of claim 7, wherein applying said second material comprises depositing a layer of atomic layer deposition.

34. A method of manufacturing a device comprising:

activating a gas containing at least one of hydrogen and of nitrogen by at least one hollow cathode discharge;

exposing a first surface of a first material to said activated gas, thereby generating at said first surface an enrichment of at least one of hydrogen and of nitrogen;

applying a further treatment to said enriched surface, thereby further comprising activating a further gas containing oxygen by a plasma discharge and exposing said first surface to said further gas at least one of before and of after said exposing to said activated gas.

35. The method of claim 34, further comprising supplying said hollow cathode discharge by AC.

36. The method of claim 35, said AC being Rf.

37. The method of claim 34, further comprising generating at least one beam of said activated gas and exposing said first surface to said beam.

38. The method of claim 37, further comprising generating more than one of said beams from said at least one hollow cathode discharge.

39. The method of claim 34, wherein said activated gas contains hydrogen.

40. The method of claim 34, further comprising performing at least one of before and of after generating said enrichment a further treatment of said first surface which comprises activating a different gas by hollow cathode discharge.

* * * * *